(12) United States Patent  
Matsumoto et al.

(10) Patent No.: US 9,227,697 B2  
(45) Date of Patent: Jan. 5, 2016

(54) BICYCLE ELECTRICAL SYSTEM DIAGNOSTIC DEVICE

(75) Inventors: Tetsuya Matsumoto, Osaka (JP); Akinori Hashimoto, Osaka (JP)

(73) Assignee: Shimano Inc., Osaka (JP)

( * ) Notice: Subject to any disclaimer, the term of this patent is extended or adjusted under 35 U.S.C. 154(b) by 341 days.

(21) Appl. No.: 13/547,646

(22) Filed: Jul. 12, 2012

(65) Prior Publication Data

US 2013/0027052 A1    Jan. 31, 2013

(30) Foreign Application Priority Data

Jul. 29, 2011    (JP) ................................ 2011-167757

(51) Int. Cl.
*B62J 99/00* (2009.01)
*B62M 25/08* (2006.01)
*G01R 31/00* (2006.01)

(52) U.S. Cl.
CPC ............... *B62M 25/08* (2013.01); *B62J 99/00* (2013.01); *G01R 31/005* (2013.01); *B62J 2099/0026* (2013.01); *B62K 2208/00* (2013.01)

(58) Field of Classification Search
CPC ........ B62J 99/00; B62M 25/08; G01R 31/005
USPC .......................................... 324/511; 73/865.9
See application file for complete search history.

(56) References Cited

U.S. PATENT DOCUMENTS

| | | | | |
|---|---|---|---|---|
| 4,831,560 A | * | 5/1989 | Zaleski | ............................ 701/36 |
| 7,819,032 B2 | * | 10/2010 | Watari et al. | ................. 73/865.9 |
| 2005/0097400 A1 | * | 5/2005 | Wu et al. | .......................... 714/38 |
| 2007/0100520 A1 | * | 5/2007 | Shah et al. | ...................... 701/33 |
| 2009/0009391 A1 | * | 1/2009 | Fox et al. | ....................... 342/372 |
| 2010/0121519 A1 | * | 5/2010 | Fountain | ............... B60T 8/1706 701/31.4 |

FOREIGN PATENT DOCUMENTS

| | | | |
|---|---|---|---|
| JP | 7-159474 A | 6/1995 |
| JP | 8-30890 A | 2/1996 |

* cited by examiner

*Primary Examiner* — Jeff Natalini
(74) *Attorney, Agent, or Firm* — Global IP Counselors

(57) ABSTRACT

A bicycle electrical system diagnostic device is provided for a bicycle electrical system in which several electric devices are connected. The diagnostic device includes a connecting section and an electric device recognizing section. The connecting section is configured to be connected to and disconnected from the electrical system. The electric device recognizing section is configured to communicate with the electrical system and recognize any of the electric devices while the connecting section is electrically connected to anyone of the electric devices.

18 Claims, 23 Drawing Sheets

BICYCLE ELECTRICAL SYSTEM DIAGNOSTIC DEVICE

CROSS-REFERENCE TO RELATED APPLICATIONS

This application claims priority under 35 U.S.C. §119 to Japanese Patent Application No. 2011-167757, filed Jul. 29, 2011. The entire disclosure of Japanese Patent Application No. 2011-167757 is hereby incorporated herein by reference.

BACKGROUND

1. Field of the Invention

This invention generally relates to a bicycle electrical system diagnostic device. More specifically, the present invention relates to a bicycle electrical system diagnostic device for a bicycle electrical system in which several electric devices are connected.

2. Background Information

There is a previously known technology in which a bicycle electric device to be diagnosed is connected to a diagnostic device and a diagnostic of the electric device is executed (see U.S. Pat. No. 7,819,032). The known diagnostic device is connected to the electric device with a connector and executes a diagnostic by communicating with the electric device.

SUMMARY

With the above mentioned diagnostic device, the electric device cannot be diagnosed unless the diagnostic device is connected directly to the electric device with a wire. Consequently, when there are multiple electric devices, it is necessary to reconnect the wire to each electric device one by one or connect separate wires from the diagnostic device to each of the electric devices in order to diagnose the electric devices.

One aspect of the present disclosure is to provide a diagnostic device for a bicycle electrical system in which several electric devices are connected such that the time required to accomplish a diagnostic is reduced.

In view of the state of the known technology, a bicycle electrical system diagnostic device according to a first aspect is provided for a bicycle electrical system in which several electric devices are connected. The bicycle electrical system diagnostic device comprises a connecting section and an electric device recognizing section. The connecting section is configured to be connected to and disconnected from the electrical system. The electric device recognizing section is configured to communicate with the electrical system and recognize any of the electric devices while the connecting section is electrically connected to anyone of the electric devices. Since the diagnostic device can recognize the electric devices that are connected together, the diagnostic device can diagnose any of the electric devices while connected to one electric device of the bicycle electrical system and enables the time required for diagnosing to be reduced.

A bicycle electrical system diagnostic device according to a second aspect is provided according to the first aspect, wherein the connecting section is connected to any one of the electric devices of the electrical system or between electric devices. With this aspect, the connecting section can be connected at a place where connecting is easily accomplished because the connecting section can be connected between electric devices or to one of the electric devices.

A bicycle electrical system diagnostic device according to a third aspect is provided according to the first or second aspect, further comprising an indicating section configured to indicate an electric device recognized by the electric device recognizing section. With this aspect, a user can ascertain whether the diagnostic device is actually recognizing an electric device because the indicating section indicates a recognized electric device.

A bicycle electrical system diagnostic device according to a fourth aspect is provided according to any one of the first to third aspects, further comprising a problem diagnosing section configured to diagnose if an electric device recognized by the electric device recognizing section has failed. With this aspect, an electric device that has failed can be identified.

A bicycle electrical system diagnostic device according to a fifth aspect is provided according to the fourth aspect, wherein the indicating section indicates a failed electric device when the problem diagnosing section determines that a problem exists. With this aspect, a user can easily ascertain which electric device has failed.

A bicycle electrical system diagnostic device according to a sixth aspect is provided according to the fourth aspect, wherein the problem diagnosing section determines if an electrical component contained in an electric device has failed. With this aspect, an electrical component contained in an electric device that has failed can be identified.

A bicycle electrical system diagnostic device according to a seventh aspect is provided according to the sixth aspect, wherein the indicating section indicates an electrical component that the problem diagnosing section has determined to have failed when the problem diagnosing section determines that a problem exists. With this aspect, a user can easily recognize which electrical component has failed.

A bicycle electrical system diagnostic device according to an eighth aspect is provided according to any one of the fourth to seventh aspects, wherein the indicating section indicates a cause of problem when the problem diagnosing section determines that a problem exists. With this aspect, a user can respond to an electrical component problem more readily because a cause of the problem is indicated.

A bicycle electrical system diagnostic device according to an ninth aspect is provided according to any one of the fourth to eighth aspects, wherein the indicating section indicates a repair method corresponding to the problem when the problem diagnosing section determines that a problem exists. With this aspect, a user can quickly replace a component or take other action because a repair method corresponding to the type of problem of the failed electrical component is indicated. Thus, a user can respond to a problem even more readily.

A bicycle electrical system diagnostic device according to a tenth aspect is provided according to any one of the first to ninth aspects, wherein the electric devices of the electrical system are connected using power line communication. The connecting section is connected to the electrical system using a power line communication line. With this aspect, the connecting section can be easily connected to any of the electric devices.

A bicycle electrical system diagnostic device according to an eleventh aspect is provided according to the tenth aspect, wherein each of the electric devices of the electrical system has a power line communication terminal. The connecting section is configured to be connected to the power line communication terminals. With this aspect, electric power can be supplied and signals can be communicated by simply connecting a power communication line to the power line communication terminals.

A bicycle electrical system diagnostic device according to a twelfth aspect is provided according to any one of the first to eleventh aspects, wherein an electric device includes a communication cable. With this aspect, trouble with the communication cable can be responded to by providing readable identification information in the communication cable.

With the disclosed bicycle electrical system diagnostic device, since the diagnostic device can recognize the electric devices that are connected together, the diagnostic device can diagnose any of the electric devices while connected to one electric device of the bicycle electrical system and enables the time required for diagnosing to be reduced.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

Figure 1:
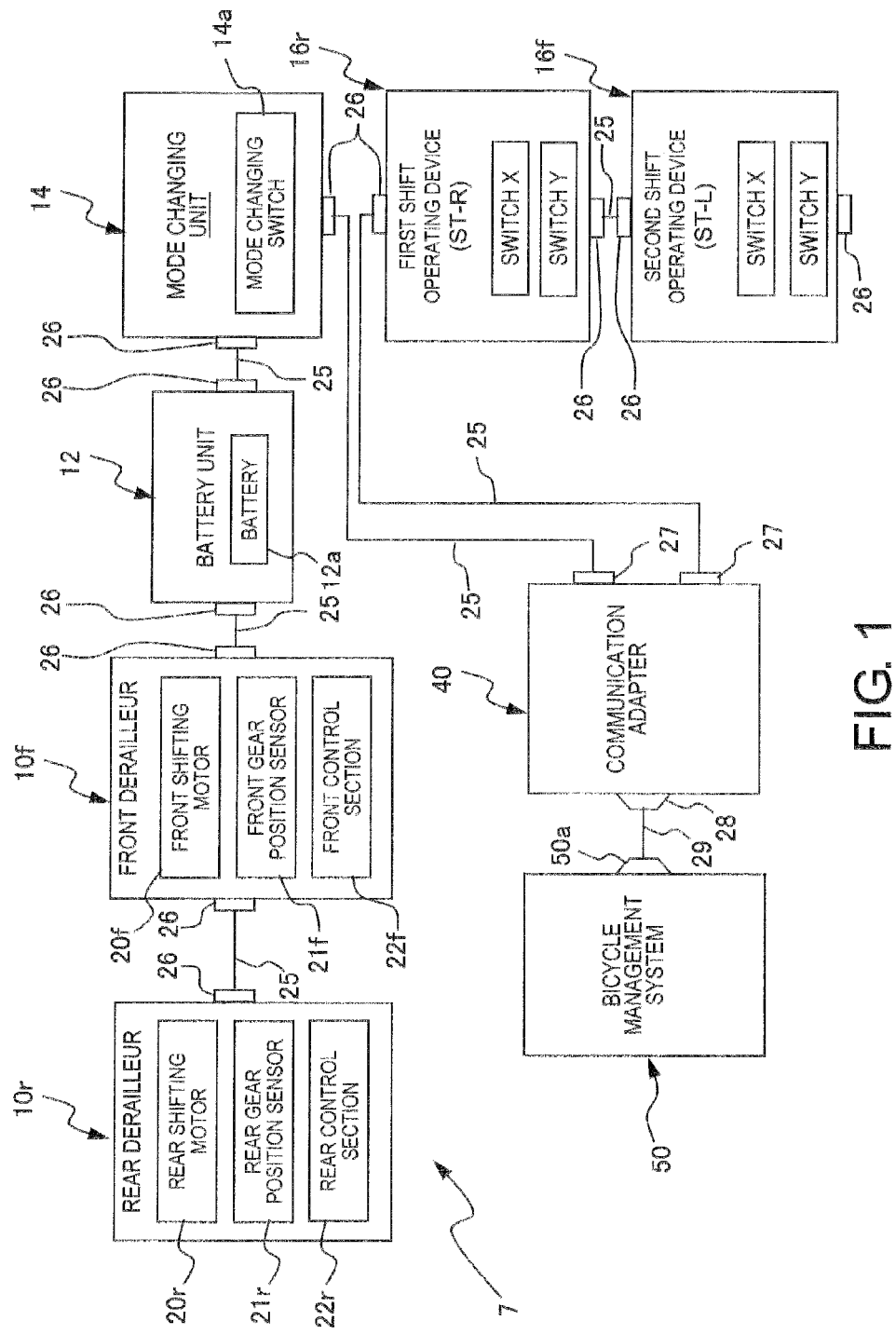
FIG. 1 is a block diagram of an electrical system connected to a bicycle electrical system diagnostic device in accordance with one embodiment.

Referring initially to FIG. 1, a bicycle electrical system 7 (hereinafter called "electrical system 7") is illustrated with a bicycle electrical system diagnostic device 30 in accordance with a first embodiment. The bicycle electrical system diagnostic device 30 includes a bicycle communication adapter 40 (hereinafter called "communication adapter 40") and a management device 50. The electrical system 7 is connected to the management system 50 via the communication adapter 40 and configured such that it can connect a plurality of electric devices using a power line communication (hereinafter called "PLC") standard. The communication adapter 40 is a connecting section that can be connected to and disconnected from the electrical system. The electrical system 7 includes an electric device connected using a PLC standard. The electrical system 7 of this embodiment has, for example, such electric devices as an electrically driven rear derailleur an electrically driven front derailleur 10f, a battery unit 12, an operating mode changing unit 14, a first shift operating device 16r, and a second shift operating device 16f. Unique identifying information (e.g., a unique identifier) is assigned to each of the electric devices. Each of the electric devices is provided with a memory from which information stored by communications can be read and in which the unique identifying information is stored.

The rear derailleur 10r has a rear shifting motor 20r, a rear gear position sensor 21r and a rear control section 22r. The rear shifting motor 20r is configured to drive a chain guide (not shown) of the rear derailleur 10r in an upshift direction and a downshift direction. The rear gear position sensor 21r is used to position the chain guide at a plurality of shift positions. The rear control section 22r controls the rear shifting motor 20r in response to operation of a switch X and a switch Y (explained later) of the first shift operation member 16r.

The front derailleur 10f has a front shifting motor 20f, a front gear position sensor 21f, and a front control section 22f. The front shifting motor 20f is configured to drive a chain guide (not shown) of the front derailleur 10f in an upshift direction and a downshift direction. The front gear position sensor 21f is used to position the chain guide at a plurality of shift positions. The front control section 22f controls the front shifting motor 20f in response to operations of a switch X and a switch Y (explained later) of the second shift operation member 16f.

The battery unit 12 holds a removable battery 12a comprising, for example, a lithium ion battery. The mode changing unit 14 is provided for selecting an operating mode of the electrical system 7 in order to fine adjust the positions of the chain guides of the front derailleur 10f and the rear derailleur 10r with respect to the gears. The mode changing unit 14 has a mode changing switch 14a. An operator can select to operate the electrical system 7 in an adjustment mode by operating the mode changing switch 14a. In the adjustment mode, a position of the chain guide of the rear derailleur 10r can be fine adjusted in an upshift direction or a downshift direction by operating the switch X or the switch Y (explained later) of the first shift operating device 16r. Also, in the adjustment mode, a position of the chain guide of the front derailleur 10f can be fine adjusted in an upshift direction or a downshift direction by operating the switch X or the switch Y (explained later) of the second shift operating device 16f.

The first shift operating device 16r has a switch X and a switch Y used for executing a shift operation of the rear derailleur 10r. The second shift operating device 16f has a switch X and a switch Y used for executing a shift operation of the front derailleur 10f. The switches X and Y of the first shift operating device 16r are provided, for example, on a brake lever for operating a front brake or on a bracket of the brake lever. The switches X and Y of the second shift operating device 16f are provided, for example, on a brake lever for operating a rear brake or on a bracket of the brake lever.

These electric devices are connected with a power communication line 25. A communication terminal 26 configured such that connectors provided on both ends of the power communication line 25 can be connected thereto is mounted on each of the electric devices. The communication terminal 26 is, for example, a two-conductor female connector. Only one communication terminal 26 is provided on an electric device (e.g., the rear derailleur 10r) located at a terminal end of the electrical system 7 and two are provided on the other electric devices. It is also acceptable to provide two communication terminals 26 on the electric device located at the terminal end. For example, in this embodiment, two communication terminals 26 are provided on the second shift operating device 16f located at a terminal end of the electrical system. Additionally, when a shift switch of a different type than the first and second shift operating devices, e.g., a satellite switch (explained later), is installed as an electric device, the shift switch can be added to the electrical system by connecting it to an unused terminal 26 of the second shift operating device 16f using the power communication line 25.

In FIG. 1 the communication adapter 40 is connected between the mode changing unit 14 and the first shift operating device 16r. However, when the communication adapter 40 is removed and the electrical system 7 is in a normal state, the mode changing unit 14 and the first shift operating device 16r are connected using the power communication line 25.

Figure 2:
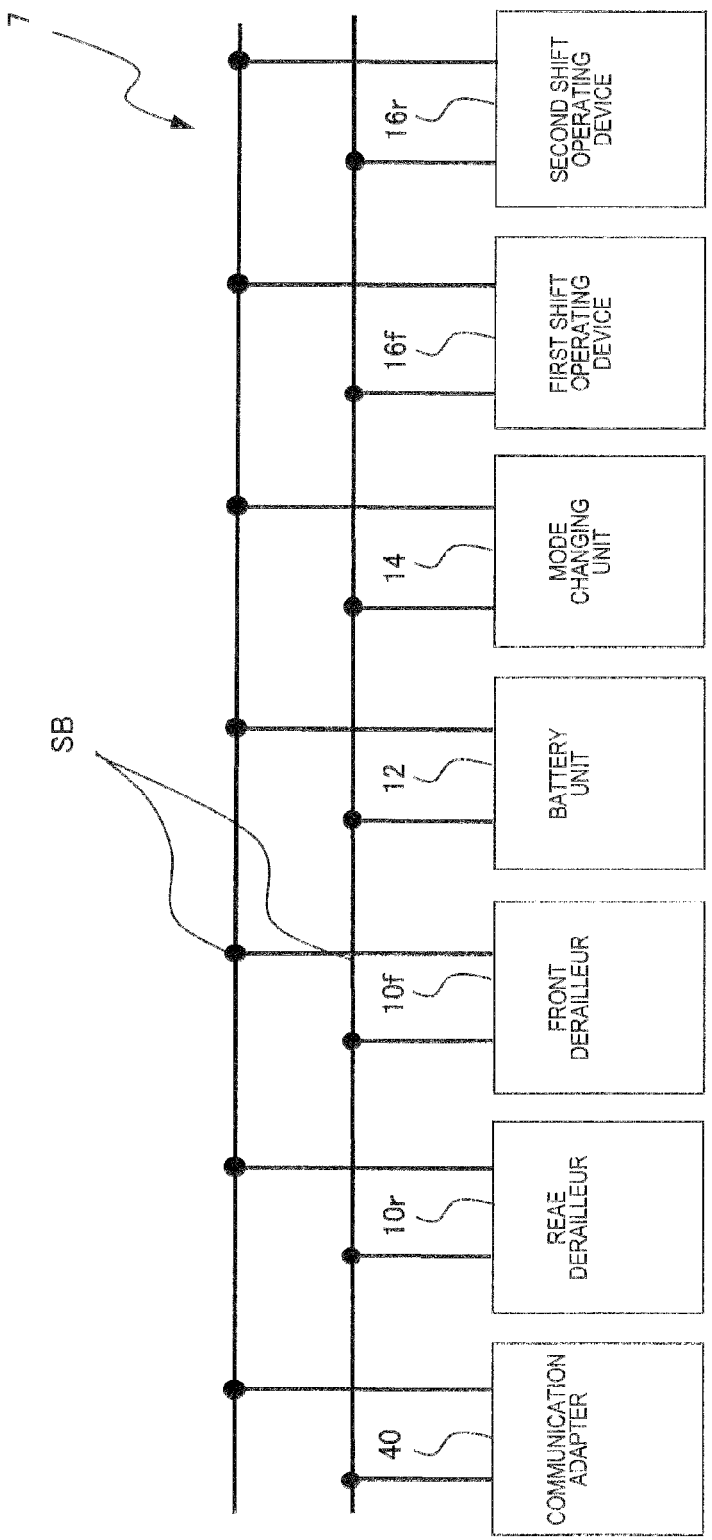
FIG. 2 is a block diagram of a bus connection structure of a bicycle electrical system.

As shown in FIG. 2, each of the electric devices is connected to a serial bus structure. As shown in FIG. 2, asocial bus SB is also provided inside the electric devices and, if a communication adapter 40 is provided, the serial bus SB is made up of the communication adapter 40, the electric devices, and the power communication line 25. As a result, regardless of whether any electric device is connected or disconnected the electric device can operate so long as it is connected to the power communication line 25. For example, in FIG. 1, even if the communication adapter 40 and the mode changing unit 14 are disconnected, the electric system 7 will operate because the battery unit 12 and the first shift operating device 16r are connected together by the power communication line 25. Also, if, for example, the front derailleur 10f is operated with a regular shift cable, then it is acceptable for the battery unit 12 and the rear derailleur 10r to be connected b the electric power communication line 25. In this case, too, the electrical system 7 will operate.

As shown in FIG. 1, the communication adapter 40 can be connected to the communication system 50 using a USB cable 29 having two communication lines and two electric power lines. The communication adapter 40 has two first communication terminals 27 for power line communication and a second communication terminal 28 that can communicate with the management system 50. The first communication terminals 27 are of the same specifications as the communication terminals 26 of the electric devices. The second communication terminal 28 comprises, for example, a USB type B female connector. Providing two first communication terminals 27 enables the communication adapter 40 to be connected such that it can communicate with all the electric devices of the electrical system 7 without providing a dedicated communication terminal specifically connecting the communication adapter to the electrical system 7. For example, although in FIG. 1 the communication adapter 40 is connected between the mode changing unit 14 and the first shift operating device 16r, the communication adapter 40 can be connected between the battery unit 12 and the front derailleur 10f or between any other two electric devices.

The management system 50 comprises, for example, a personal computer (hereinafter called "PC") having a USB input/output terminal 50a (e.g., a USB type A female connector). The management system 50 includes a display and an input device, such as a keyboard or a mouse. The management system 50 uses diagnostic software stored inside the PC to execute problem diagnosing of the electric devices, settings of the electric devices, and such management processing as updating the firmware of the electric devices.

Figure 3:
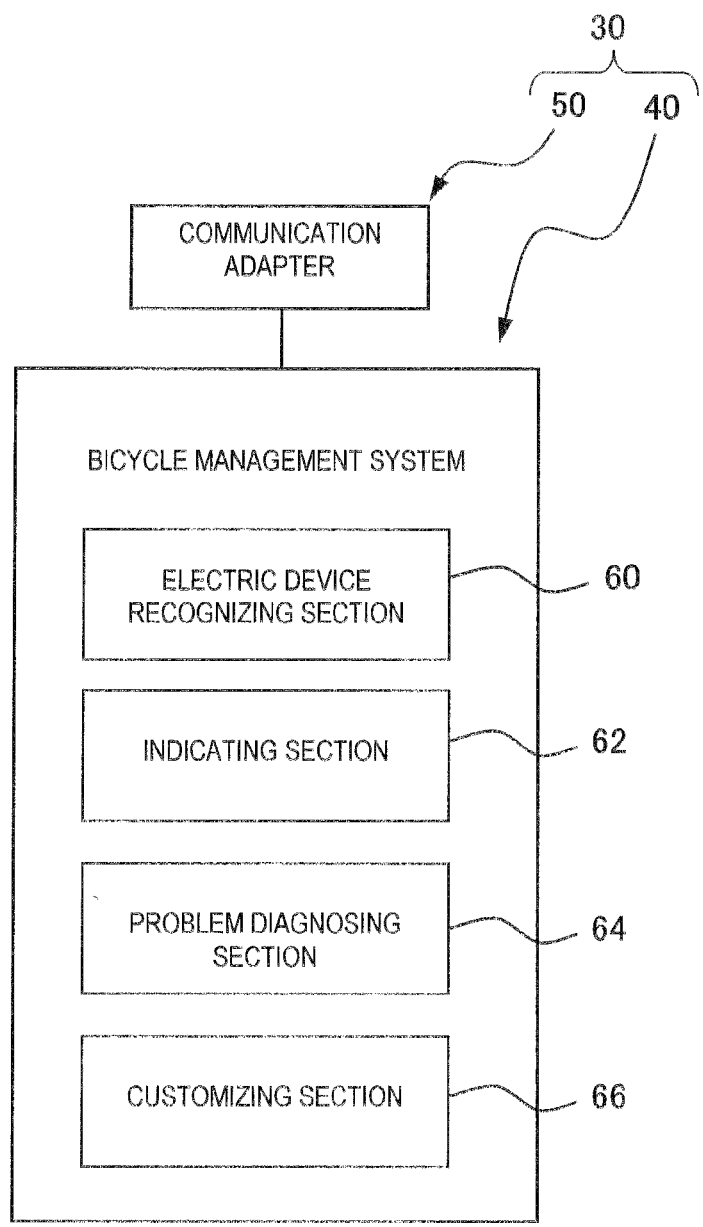
FIG. 3 is a block diagram illustrating a function configuration of the diagnostic device.

As shown in FIG. 3, the management system 50 has the following functional components that are realized by executing the software: an electric device recognizing section 60, an indicating section 62, a problem diagnosing section 64, and a customizing section 66. When the communication adapter 40 is connected to any one of the electric devices, the electric device recognizing section 60 can communicate with the electrical system 7 and recognize the electric devices of the electrical system 7. The indicating section 62 indicates the electric devices recognized by the electric device recognizing section 60 on the display. The problem diagnosing section 64 diagnoses whether a problem has occurred in the electric devices recognized by the electric device recognizing section 60. In this embodiment, the problem diagnosing section 64 also diagnoses whether a problem has occurred in the electrical components contained in the electric devices recognized by the electric device recognizing section 60.

If the problem diagnosing section 64 determines that a problem has occurred, the indicating section 62 indicates the electric device that the problem diagnosing section 64 has determined to have failed on the display. Also, in this embodiment, when the problem diagnosing section 64 has determined that a problem occurred, the problem diagnosing section 64 indicates an electrical component that the problem diagnosing section 64 has determined to have failed on the display. Examples of electrical components contained in the electric devices include switches in the first and second shift operating devices 16r and 16f and motors and position sensors contained in the front and rear derailleurs 10f and 10r.

The indicating section 62 also indicates a cause of problem on the display when the problem diagnosing section 64 determines that a problem has occurred. The indicating section 62 also indicates a cause of problem on the display when the problem diagnosing section 64 determines that a problem has occurred. The customizing section 66 is used to execute custom settings of the switches and other electrical components in the electric devices.

The PC functions as the management system 50 when the problem diagnosing section 64 executes the diagnostic software in response to an instruction from the input device. The flow of the operations executed by the diagnostic software will now be explained using the flowcharts shown in FIGS. 4, 5, 6 and 7.

Figure 4:
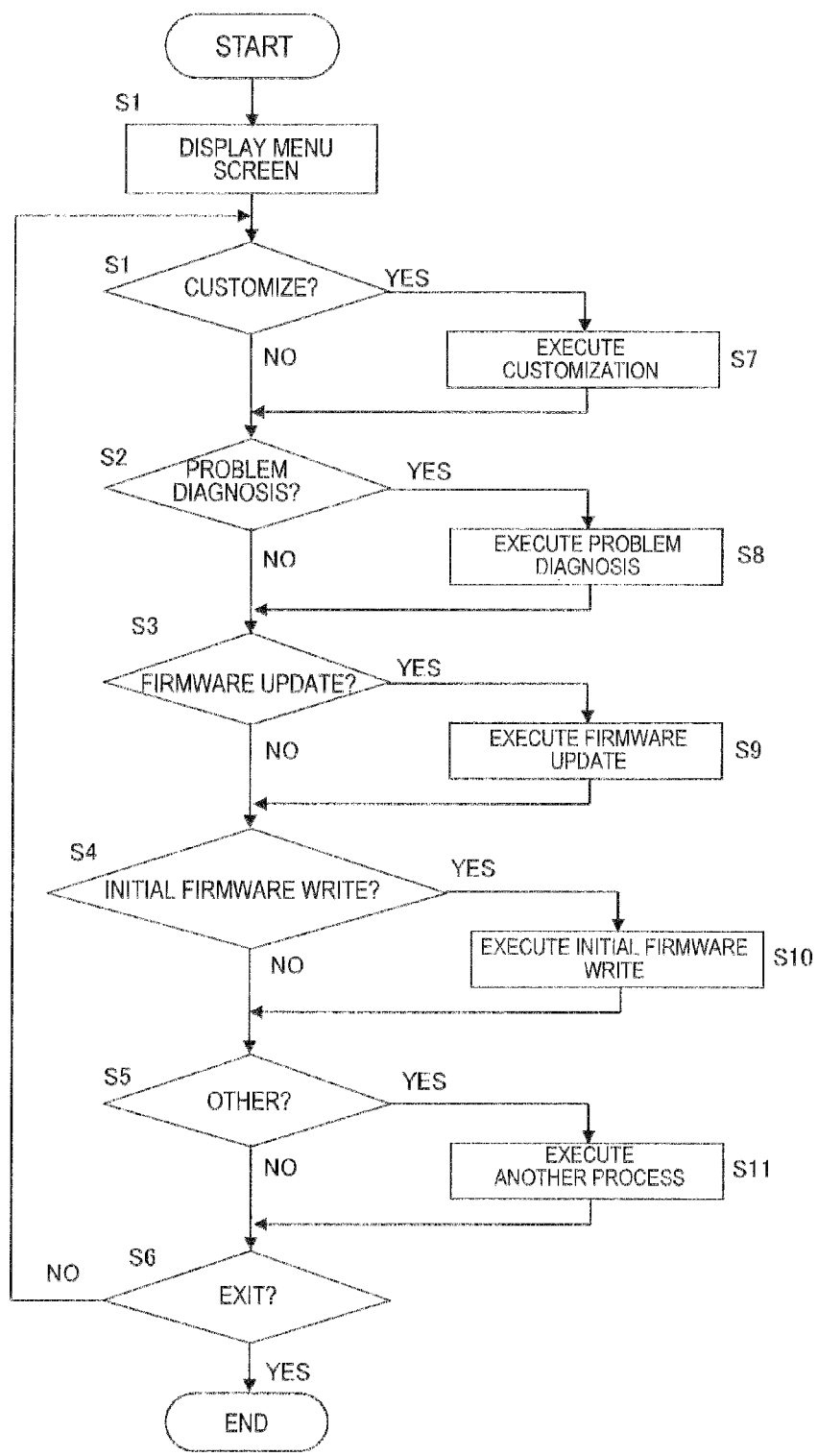
FIG. 4 is a flowchart of a diagnostic software.

When the diagnostic software is started, the management system 50 proceeds to step S1 in FIG. 4 and presents a menu screen for the diagnostic software on the display. An example of the menu screen is shown in FIG. 8.

Figure 8:
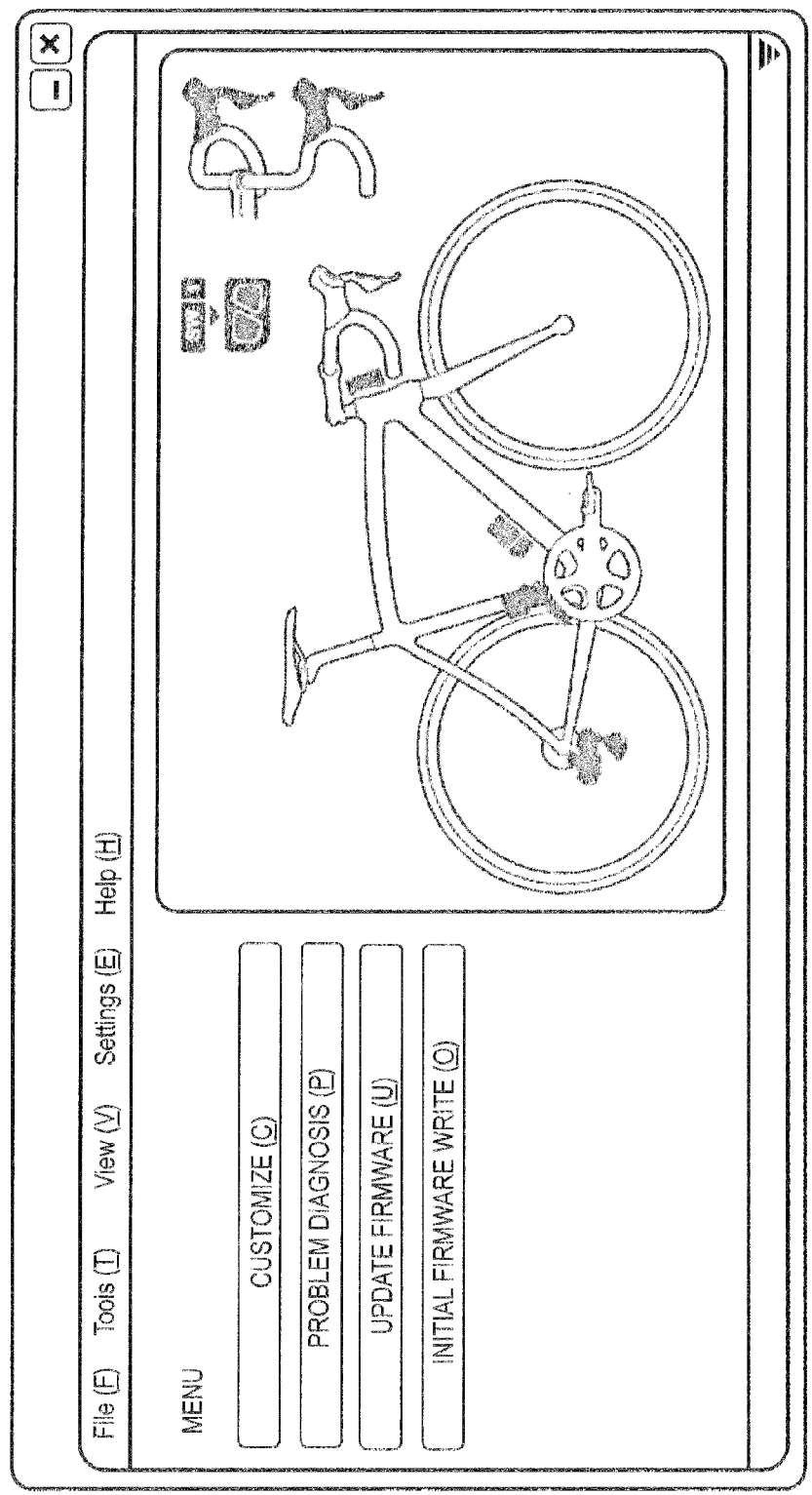
FIG. 8 shows an example of a Diagnosis Process menu screen.

In FIG. 8, a menu bar is displayed on an upper portion of the screen. An image of an entire bicycle is displayed on a right side of the screen and indicates electric devices (hereinafter called "units") that can be installed on the bicycle in a recognizable fashion. The units are indicted, for example, in different colors and/or lighter shades than other parts of the bicycle. A list of selectable items that can be executed by the diagnostic software is displayed on the left side of the screen. Although the selectable items are indicated in vertical list in this example, it is acceptable for the items to be displayed in a horizontal list or in a matrix form. There are, for example, four selectable items: "Customize," "Problem Diagnosis," "Update Firmware," and "Initial Firmware Write." An operator selects one of the four selectable items by using the input device to align a cursor with the item.

In step S2 of FIG. 4, the management system 50 determines if Customize has been selected. In step S2, the management system 50 determines if Problem Diagnosis has been selected. In step S3, the management system 50 determines if Update Firmware has been selected. In step S4, the management system 50 determines if Initial Firmware Write has been selected. In step S5, the management system 50 determines if another operation has been selected, such as an item contained in the menu bar. In step S6, the management system 50 determines if "Exit" has been elected from a pull down menu accessed from "File" in the menu bar. If "Exit" has been selected, then management system 50 closes the diagnostic software.

Figure 9:
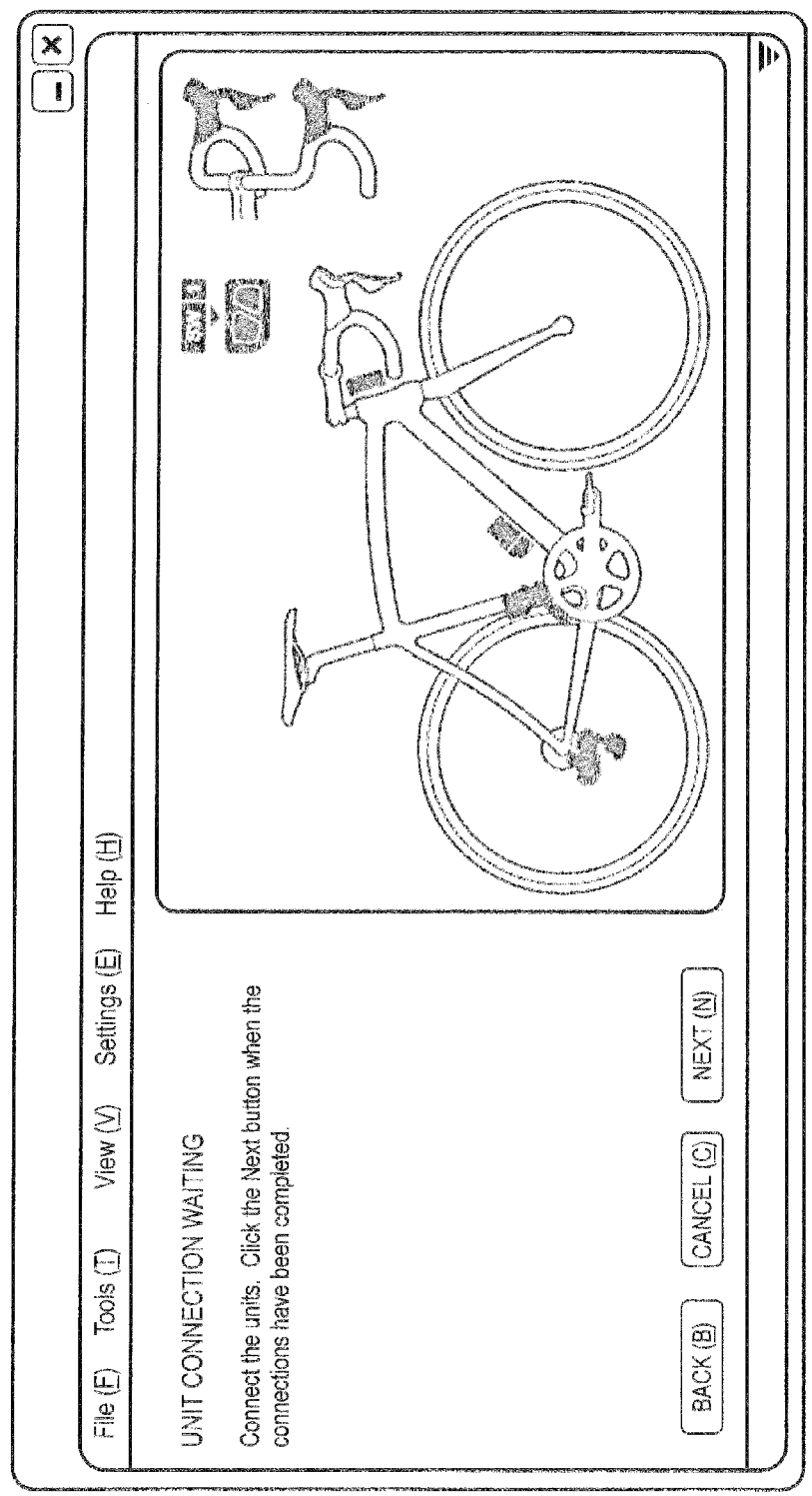
FIG. 9 shows an example of a unit connection waiting screen displayed during a customizing process.

If it determines that Customize has been selected in step S2, then the management system 50 proceeds from step S1 to step S7. In step S7, the management system 50 executes customization processing. The customization processing enables an operator to change a unit targeted for operation and to change function settings of a unit as desired. When the customization processing starts, a connection waiting screen is displayed as shown in FIG. 9 to wait for the diagnostic device to be connected to a unit of the electrical system 7 of the bicycle. After the operator has completed connecting the management system 50 to the unit of the electrical system 7 through the communication adapter 40, the operator aligns the cursor with the item "Next" indicated on the display and selects "Next". Hereinafter, aligning the cursor with an item and selecting the item will be explained as simply selecting the item. When "Next" is selected, the management system 50 recognizes the unit it is connected to and an attribute of the unit. In other words, the management system 50 identifies the unit it is connected to.

Figure 10:
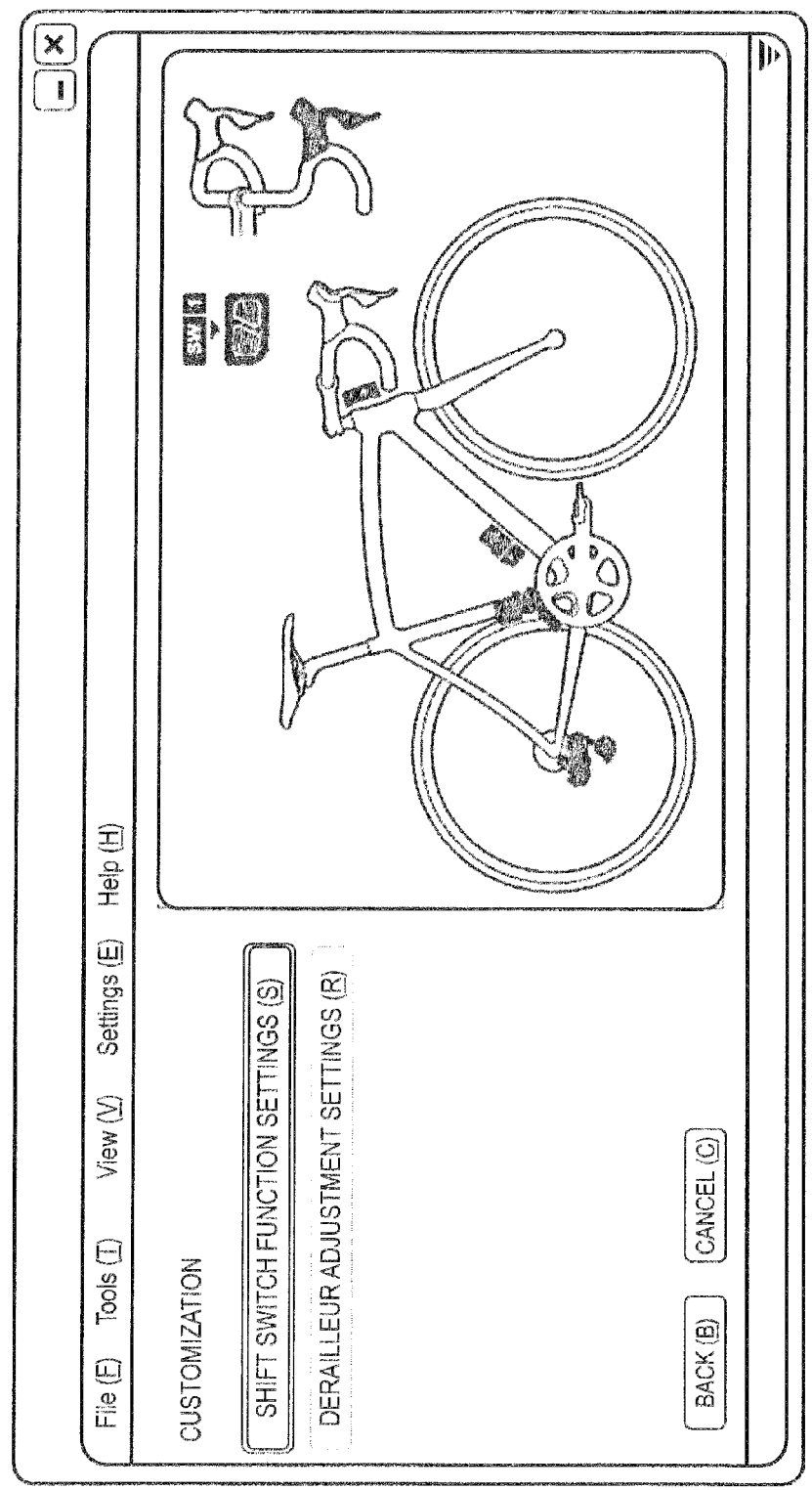
FIG. 10 shows an example of a shift switch function setting screen displayed during a customizing process.

When the management system 50 finishes recognizing the unit, an image of the entire bicycle is displayed on the right side of the screen with the recognized unit depicted in a different format than units that were not recognized, as shown in FIG. 10. For example, the recognized unit is depicted with a bold outline of the shape of the unit. For the purposes of explanation, FIG. 10 illustrates a situation in which only the first shift operating device 16r has been recognized. If other units were recognized, the recognized units are likewise indicated in a different format from units that were not recognized.

The screen shown in FIG. 10 displays the selectable items "Shift Switch Function Settings" and "Derailleur Adjustment Settings." If the first shift operating device 16r has been recognized, then Switch Function Settings can be selected. If the front derailleur 20f or the rear derailleur 10r has been recognized, then "Derailleur Adjustment Settings" can also be selected.

Figure 11:
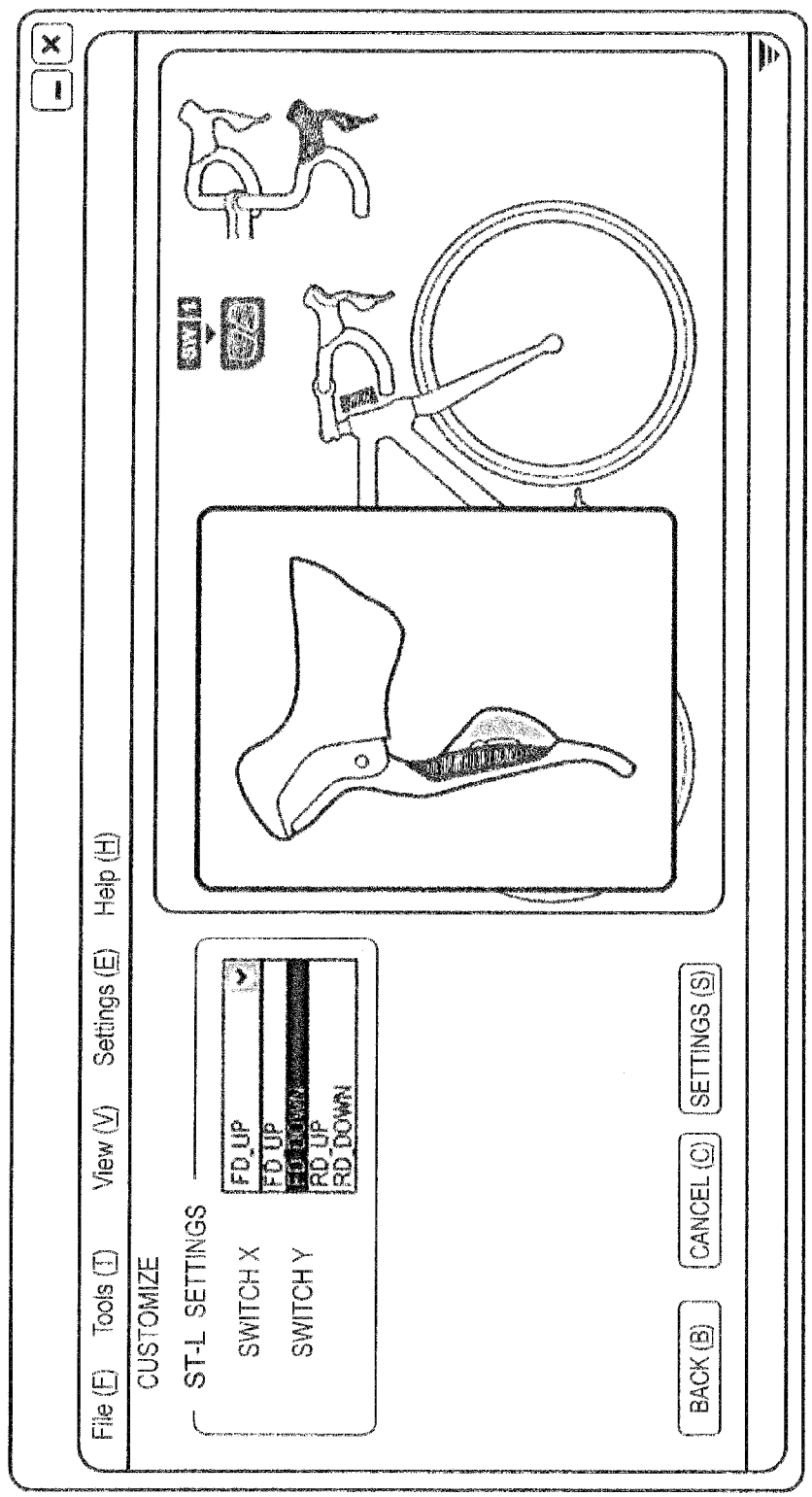
FIG. 11 shows an example of a shift switch setting screen displayed during a customizing process.

When "Shift Switch Function Settings" is selected, the functions of the switches X and Y of the first shift operating device 16r and/or the second shift operating device 16f recognized by the management system 50 can be set as desired. In this example, since the first shift operating device 16r has been recognized, the functions set for the switches X and Y of the first shift operating device 16r are displayed as shown in FIG. 11. An operator can set the functions assigned to the switches X and Y of the first shift operating device 16r as desired. The function to be assigned to the switch X and the function to be assigned to the switch Y can be changed easily by selecting the desired function from a pull down menu. After selecting a function to be assigned to the switch X and a function to be assigned to the switch Y from the pull down menu, the operator selects a Set button displayed on the screen to execute communication between the management system 50 and the first shift operating device 16r and set the functions of the switches. Each of the switches X and Y of the first shift operating device 16r and the second shift operating device 16f can be set to upshift or downshift the front derailleur 10f or to upshift or downshift the rear derailleur 10r. For example, the switch X of the first shift operating device 16r could be set to upshift the front derailleur and the switch Y of the first shift operating device 16r could be set to upshift the front derailleur 10f.

If "Derailleur Adjustment Settings" is selected, then the positions of the front and rear derailleurs 10f and 10r recognized by the management system 50 can be fine adjusted with respect to each of the gears. An amount by which a position of a derailleur will be adjusted in a downshift direction or an upshift direction is set by inputting a numerical value using the input device or by selecting a numerical value from a pull down. The management system 50 transmits information related to the numerical value to the front or rear derailleur 10f or 10r.

If "Problem Diagnosis" is selected, then the management system 50 proceeds from step S2 to step S8. In step S8, the management system 50 executes the problem diagnostic processing shown in FIG. 5. In step S21 of the problem diagnostic processing shown in FIG. 5, the management system 50 displays the Problem Diagnosis menu screen shown in FIG. 12. From the Problem Diagnosis menu screen, an operator can select "System Diagnosis" or "Individual Diagnosis."

With the System Diagnosis, an operator selects which units are connected to the electrical system 7 and the management system 50 identifies the units that are actually connected as a part of the electrical system 7. Thus, a unit that has been selected by the operator but not recognized by the management system 50 is possibly failing. Also, the system diagnostic processing executes a Problem Diagnosis with respect to units that have been recognized.

The Individual Diagnosis does not include a selection process in which the operator selects which units are connected to the electrical system 7 and, instead, diagnoses each individual unit recognized by the management system 50 for problem. In step S22, the management system 50 determines if "System Diagnosis" has been selected. In step S23, the management system 50 determines if "Individual Diagnosis" has been selected. In step S24, the management system 50 determines if Exit has been elected from a pull down menu accessed from "File" in the menu bar. If Exit has been selected, then the management system 50 returns to the processing shown in FIG. 4.

Figure 6:
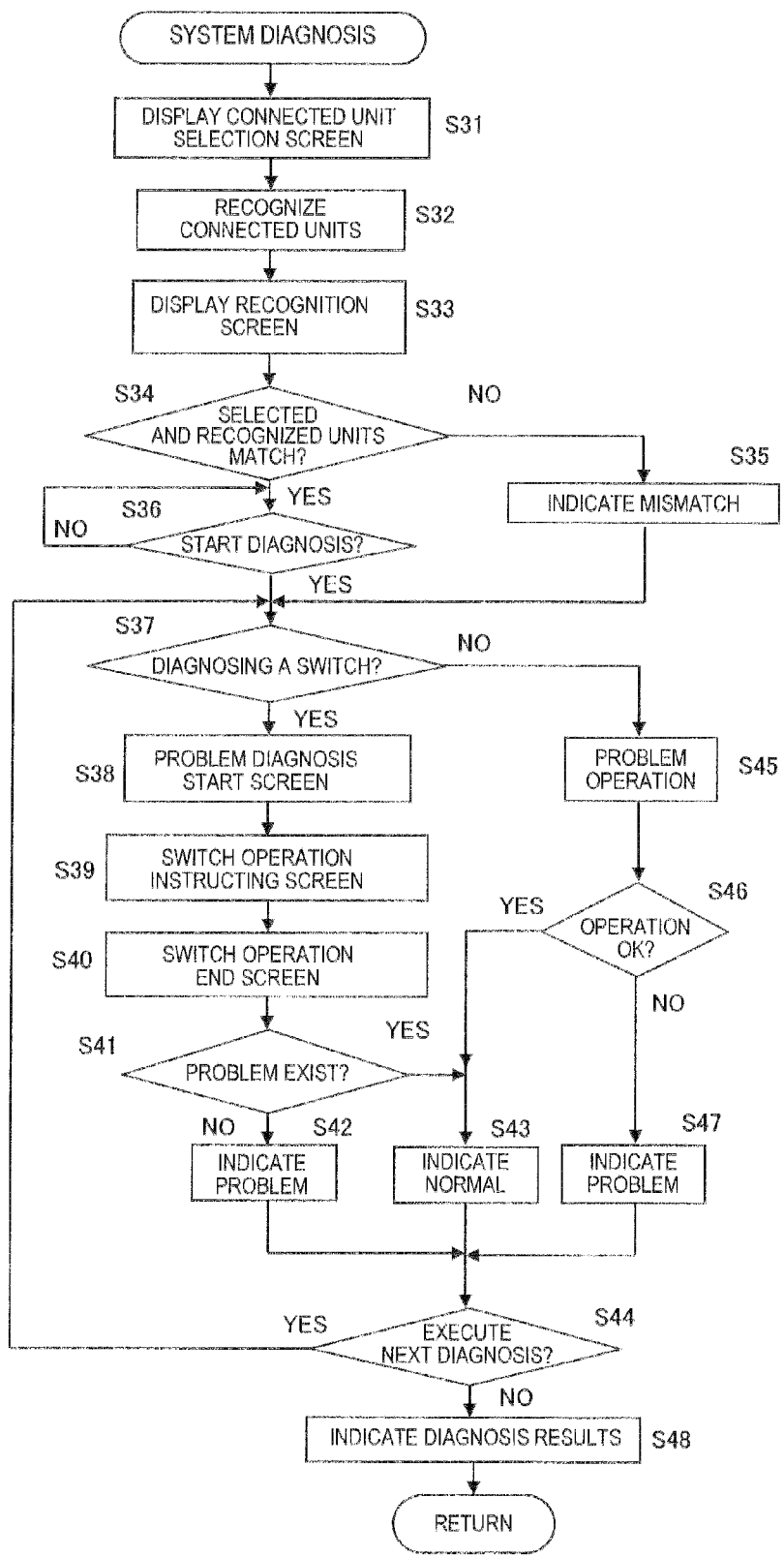
FIG. 6 is a flowchart of a system diagnosis process.
Figure 12:
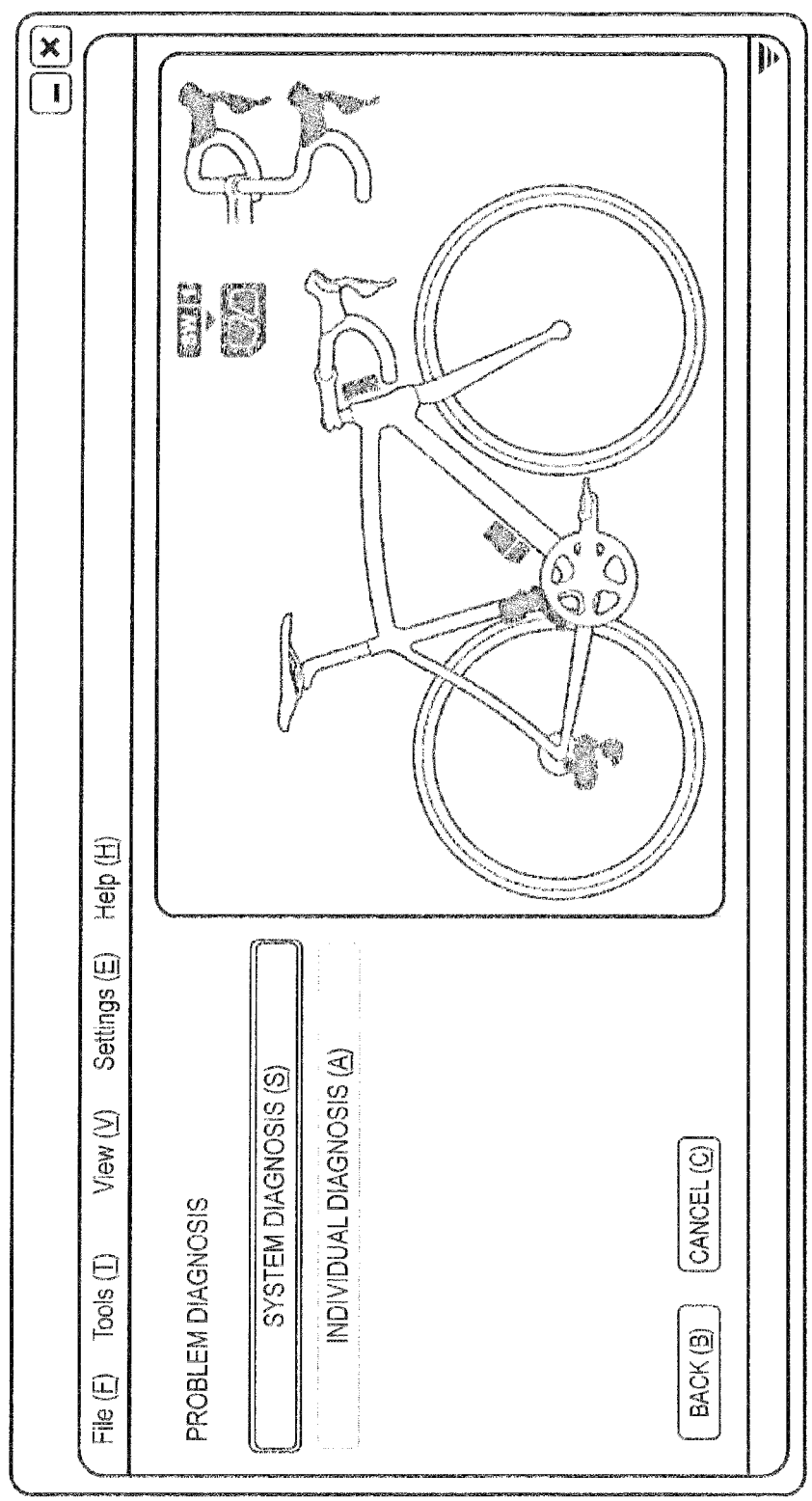
FIG. 12 shows an example of a Problem Diagnosis process menu screen.
Figure 13:
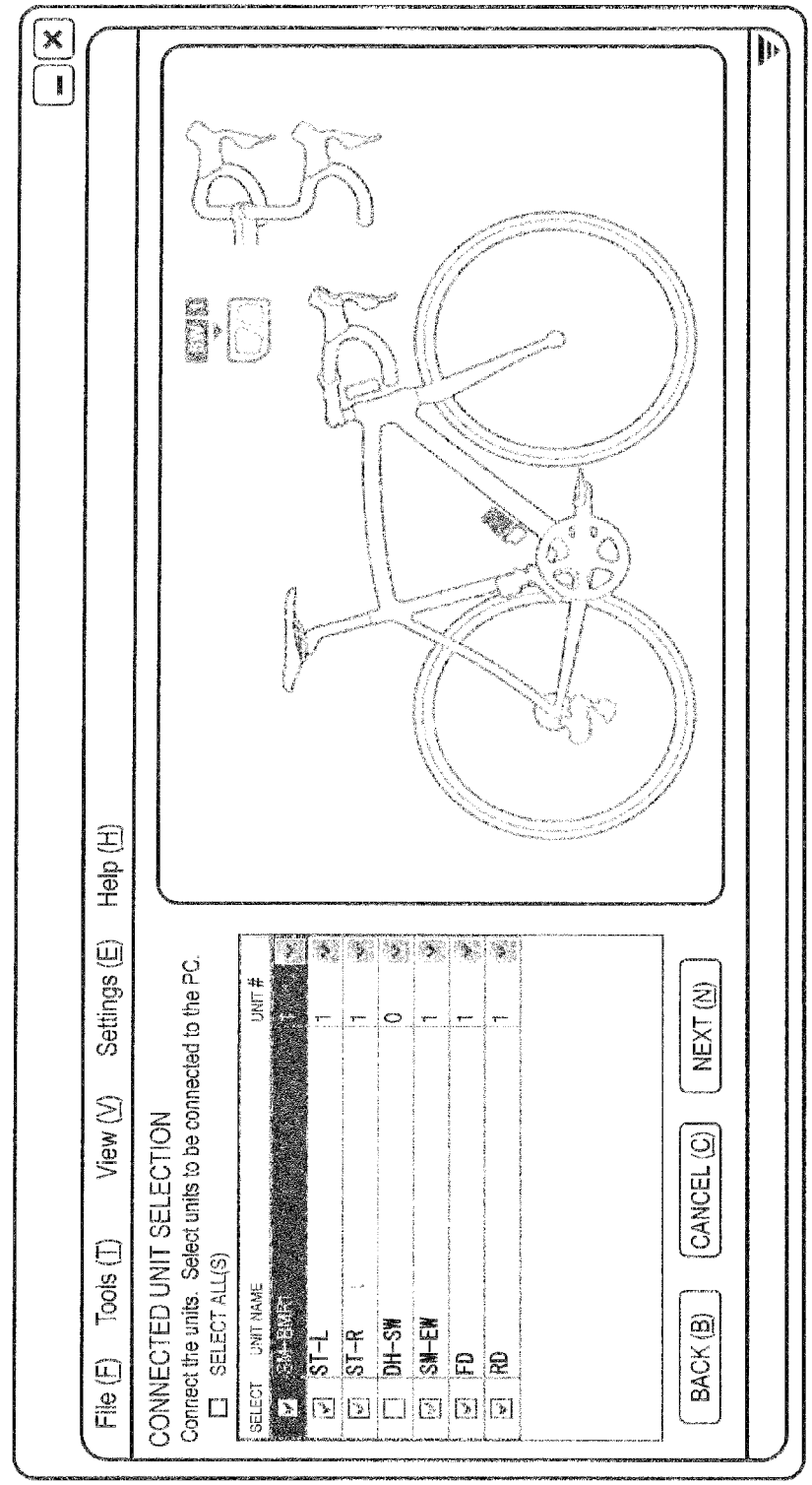
FIG. 13 shows an example of a Connected Unit Selection screen displayed during a system diagnostic process.

If "System Diagnosis" is selected from the Problem Diagnosis menu screen shown in FIG. 12, then the management system 50 proceeds from step S22 to step S25 and executes the system diagnostic processing shown in FIG. 6. In step S31 of the system diagnostic processing shown in FIG. 6, the Connected Unit Selection screen shown in FIG. 13 is displayed. The Connected Unit Selection screen shows all of the units that can be connected to the electrical system 7. The symbol "SM-BT" indicates the battery unit 12. The symbol "ST-L" indicates the second shift operating device 16f. The symbol "ST-R" indicates the first shift operating device 16r. The symbol "DH-SW" indicates a satellite switch. Although an image of a satellite switch is shown on the Connected Unit Selection screen, the satellite switch is not connected in this embodiment. The satellite switch is a shifter switch that can be mounted to a handle bar in a different position than the first shift operating section 16r and the second operating section 16f. The symbol "FD" indicates the front derailleur 10f. The symbol "RD" indicates the rear derailleur 10f.

As shown in FIG. 13, a list of units that can be connected to the electrical system 7 is displayed on the Connected Unit Selection screen. The Connected Unit Selection screen includes, for example, an explanatory sentence saying "Select units to be connected to the PC," a "Back" button for returning to a previous screen, a "Cancel" button for aborting the unit selection operation, and a "Next" button for proceeding to a subsequent operation. The "Back" and "Cancel" buttons are shown on other screens as well. Regardless of the screen, selecting "Back" causes the immediately previous screen to be displayed and selecting "Cancel" cancels the current operation.

The Connected Unit Selection screen indicates a check box and a number of units connected for each unit type. The input device can be operated to insert and remove check marks to and from the check boxes. The input device can also be operated to select a number of units connected for each unit type using a pull down list. From the screen shown in FIG. 13, the operator puts a check mark in the check box of each of the units connected in the electrical system 7. When a check is put in a check box, the indicated number of connected units goes to 1. If a different number of units is/are connected, then the operator changes the number of connected units. If a "Select All" check box is checked, then check marks are put into the check boxes of all the units at once. FIG. 13 illustrates a situation in which check marks have been put in the check boxes corresponding to the six units excluding the DH-SW.

So long as a check mark is in at least one of the check boxes, the Next bottom can be selected. When an operator selects "Next", the management system 50 proceeds to step S32 and communicates with the units to recognize the units. The management system 50 identifies the units by reading unique identification information that each of the units possesses. The management system 50 issues a command to each of the units instructing the unit to send the identification information. When a unit receives a command from the management system 50, it outputs the stored identification information. The management system 50 can recognize each of the units by receiving the identification information outputted from each of the units.

Figure 14:
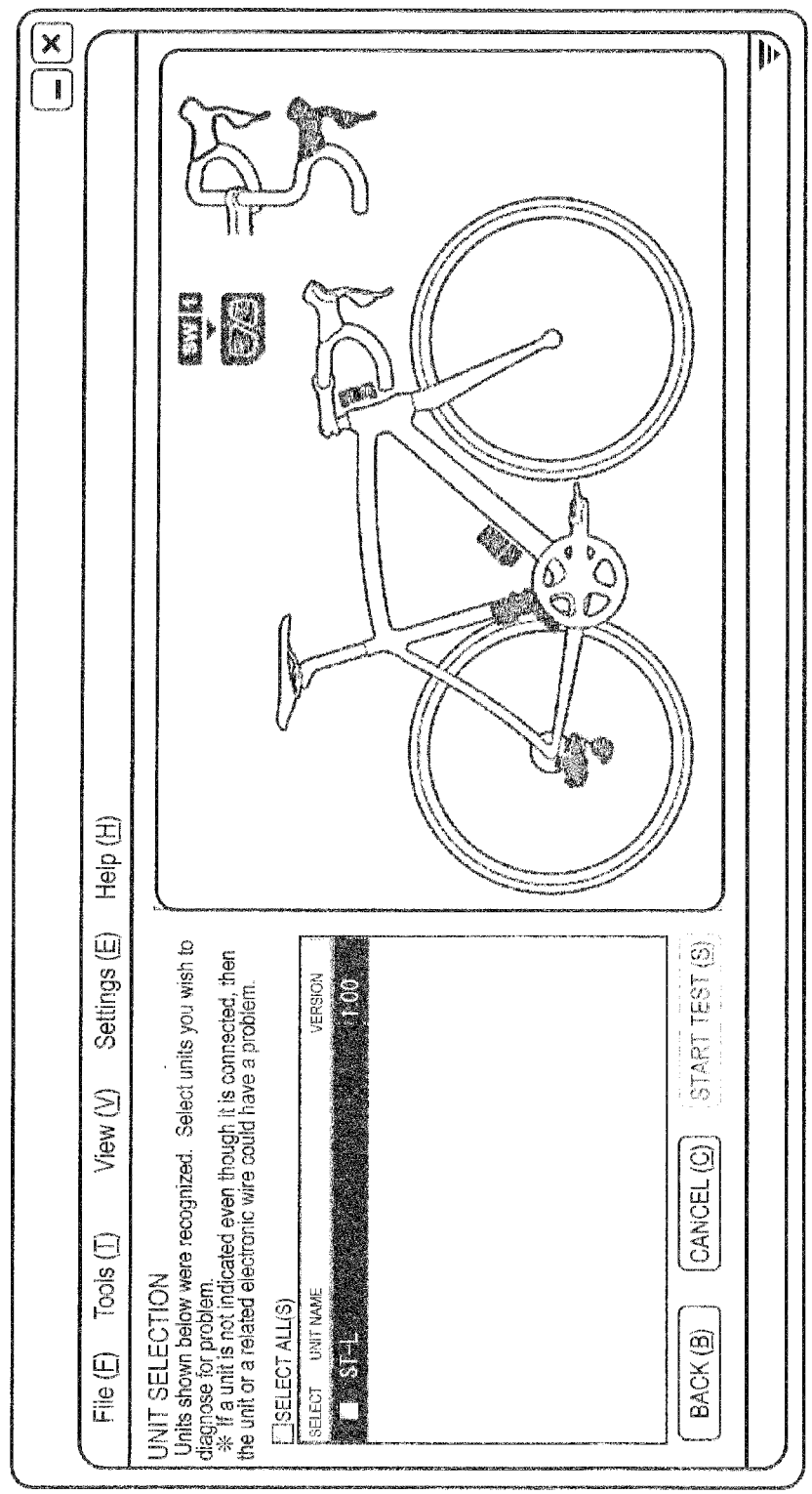
FIG. 14 shows an example of a unit recognition screen displayed during a system diagnostic process or an individual diagnostic process.

In step S33, the management system 50 displays the unit recognition screen shown in FIG. 14. The unit recognition screen presents, for example, the following explanation:

"Units shown below were recognized. Select units you wish to diagnose for problem. *If a unit is not indicated even though it is connected, then the unit or a related electronic wire could have a problem."

Additionally, the unit recognition screen presents a name and an image of recognized unit in addition to the image of the entire bicycle. The management system 50 displays a corresponding check box next to the name of each unit in the list of recognized units. In this embodiment, as explained previously, only the second shift operating device 16f is connected and the other units are not connected. Consequently, since only the second shift operating device 16f is recognized, the unit selecting screen displays the name of the first shift operating device 16r and displays the image of the first shift operating device 16r in a different format than the other units.

By looking at the unit recognition screen, an operator can identify which units were not recognized despite being connected to the electrical system 7. If a unit is not displayed even though it is connected, then there is a possibility that the unit or a related electronic wire has failed and a user can discover that a unit has failed.

Although the unit recognition screen shown in FIG. 14 depicts a situation in which only the second shift operating section 16f was recognized, if other units were recognized, then the name of those units will be displayed in the list and the images of the recognized units will be displayed along with the image of the entire bicycle using a different display format than the images of units that were not recognized.

In step S34, the management system 50 compares the units selected in step S31 with the units recognized in step S32. Then, the management system 50 determines if the units match. If the units do not match, the management system 50 proceeds to step S35. In step S35, the management system 50 displays the symbol and the image of the units that did not match. In step S35, it is acceptable to display only the symbols of units that did not match or to include both the symbols of the units that did match and the symbols of the units that were selected.

In this way, an operator can readily identify which units were not recognized even though they are connected to the electrical system 7. In the example presented above, since the first shift operating section 16r is the only one of the six units selected that is actually connected to the electrical system 7, the remaining five units are not recognized. However, if all six units are both connected and selected, then any of the six units that cannot not recognized has some kind of problem.

In the unit recognition screen shown in FIG. 14, if a check mark is put in the check box of a unit that was recognized, then the button "Start Test" will become selectable. After the units are determined to match in step S34 or after step S35 ends, the management system 50 proceeds to step S36. In step S36, the management system 50 determines if an operator has selected "Start Test". If it determines in step S36 that "Start Test" has been selected, then the management system 50 proceeds to step S37.

The processing executed in step S37 and subsequent steps is executed successively with respect to each of the recognized units. If it is necessary to execute a plurality of diagnoses with respect to one unit, then diagnosing of the next unit is not started until all of the diagnoses of the one unit have been completed. A situation in which one unit requires more than one diagnose occurs when, for example, the one unit has a plurality of switches. It is acceptable for the order in which the units are diagnosed to be the same as the order in which the management system 50 recognized the units; it is also acceptable for the order to be determined in advance. In step S37, the management system 50 determines if the electrical component of the unit to be diagnosed is a switch operated by an operator or something other than a switch. If the electrical component is a switch, then the management system 50 proceeds from step S37 to step S38.

Figure 15:
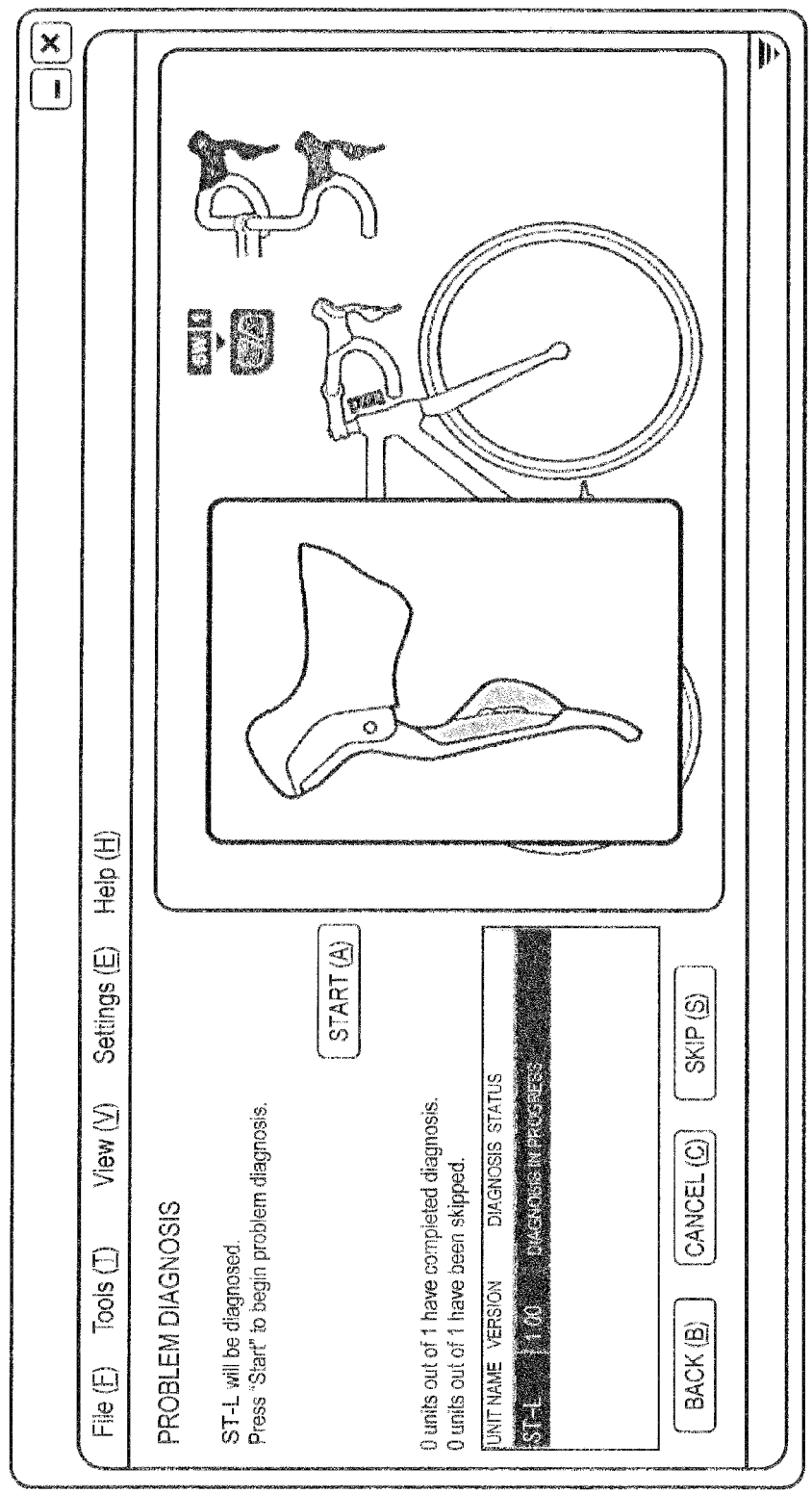
FIG. 15 shows an example of a Problem Diagnosis screen (Problem Diagnosis start screen) displayed during a system diagnostic process or an individual diagnostic process.

In step S38, the management system 50 displays a Problem Diagnosis screen (Problem Diagnosis start screen) like that shown in FIG. 15. Here, a situation in which ST-L is diagnosed will be explained. In FIG. 15, the message "ST-L will be diagnosed. Press "Start" to begin problem diagnosis" is displayed along with a "Start" button. The Problem Diagnosis screen also includes a "Skip" button. By selecting "Skip", an operator can end diagnosing of a unit while diagnosing is in progress. If there are two or more unit being diagnosed, then the diagnosing of the next unit will start when "Skip" is selected. As shown in FIG. 15, the units targeted for diagnosing are displayed in a different format than other units on the Problem Diagnosis screen. For example, the units to be diagnosed are displayed in a different color or a lighter or darker shade. Also, as shown in FIG. 15, it is acceptable for an enlarged image of a unit being diagnosed to be displayed on the Problem Diagnosis screen. It is also acceptable for only the unit currently being diagnosed to be displayed in a different format on the Problem Diagnosis screen.

Figure 16:
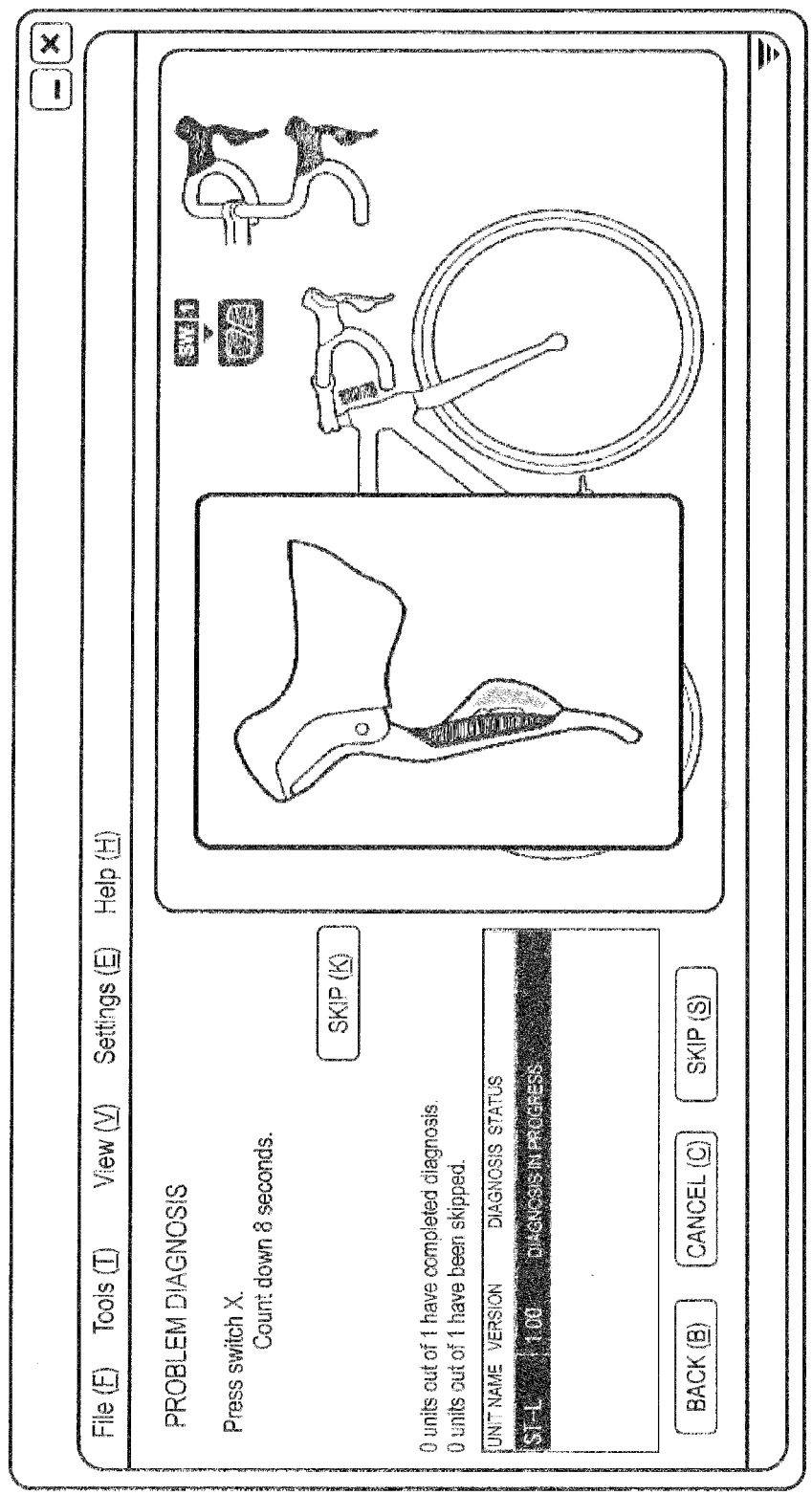
FIG. 16 shows an example of a Problem Diagnosis screen (switch operation instructing screen) displayed during a system diagnostic process or an individual diagnostic process.

When the Start button shown in FIG. 15 is selected, the management system 50 proceeds to step S39. In step S39, the management system 50 displays the Problem Diagnosis screen (switch operation instructing screen) shown in FIG. 16 and starts a tinier. As shown in FIG. 16, electrical components targeted for diagnosing are displayed in a different format than other electrical components on the Problem Diagnosis screen. For example, the units to be diagnosed are displayed in a different color or a lighter or darker shade. A message informing an operator that it is necessary to operate a switch, e.g., "Press and hold switch X," is displayed on the switch operation instructing screen and a countdown of time is executed by a timer. The countdown time is also displayed simultaneously on the switch operation instructing screen. The timer is set to, for example, 10 seconds. By the time the countdown ends, the management system 50 determines if the switch was pressed and proceeds to step S40. The management system 50 stops the counting of the timer when it determines that the switch has been pressed.

Figure 17:
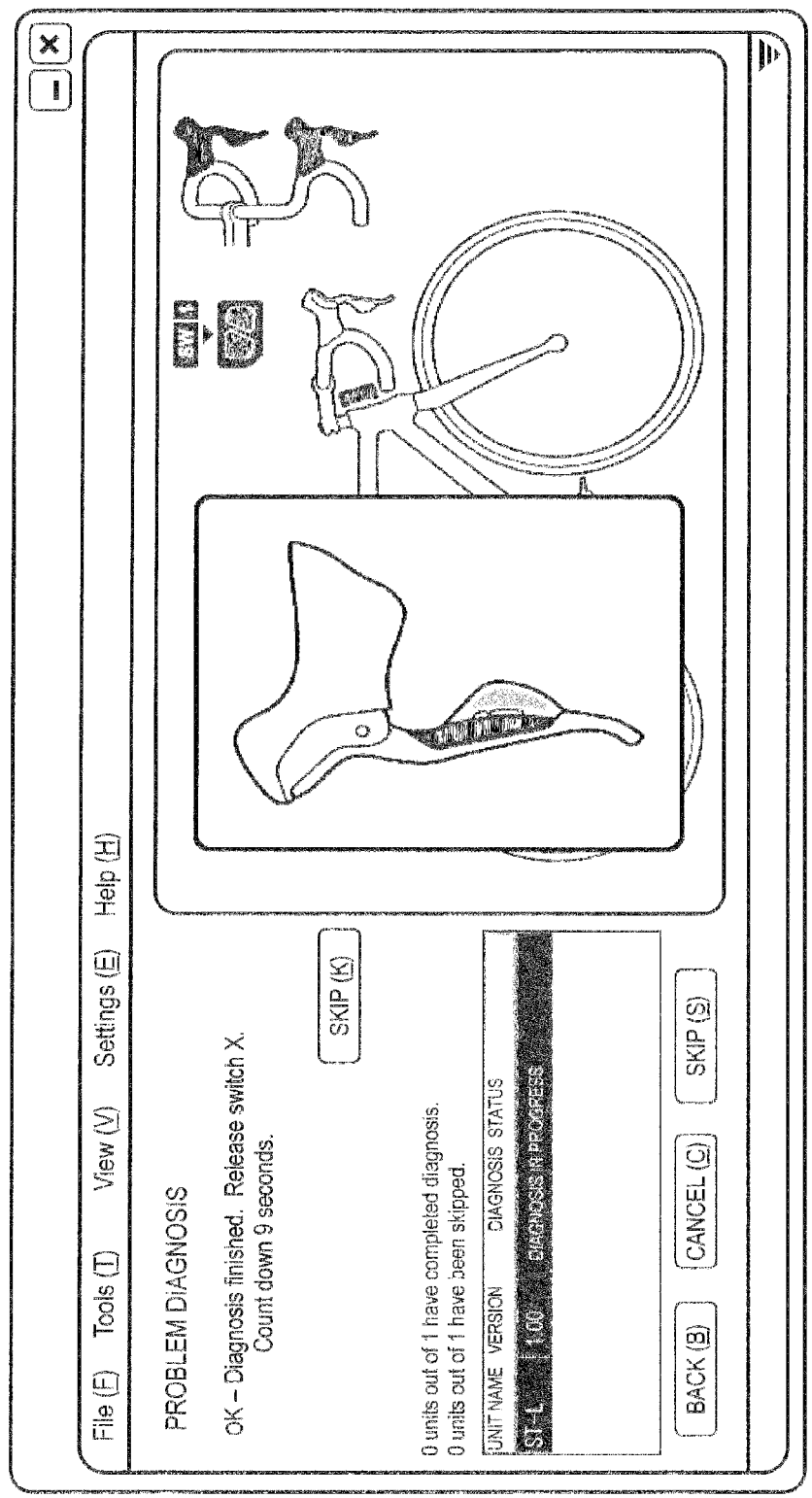
FIG. 17 shows an example of a Problem Diagnosis screen (switch operation ending screen) displayed during a system diagnostic process or an individual diagnostic process.

In step S40, the management system 50 displays the Problem Diagnosis screen (switch operation end screen) shown in FIG. 17 and starts a timer. A message informing an operator that it is necessary to stop operating the switch, e.g., "Diagnosis finished. Release switch X." is displayed on the switch operation end screen and a countdown of time is executed by a timer. The countdown time is also displayed simultaneously on the switch operation end screen. The timer is set to, for example, 10 seconds. By the time the countdown ends, the management system 50 determines if the switch has been released. The management system 50 stops the counting of the timer when it determines that the switch is no longer pressed.

If it determines that a switch problem has not occurred based on the results of steps S39 to S41, then the management system 50 proceeds to step S43. If the management system 50 determines that a switch was operated in step S39 and determines that the switch is no longer pressed in step S40, then the management system 50 proceeds to step S43. In step S43, the management system 50 displays a Problem Diagnosis screen (electrical component normal screen) like that shown in FIG. 18 indicating that the switch is normal. The electrical component normal screen displays a message, e.g., "Diagnosis of switch X is finished. No problems found," expressing that the Problem Diagnosis has ended and a problem does not exist.

If it determines that a switch problem has occurred based on the results of steps S39 to S41, then the management system 50 proceeds to step S42. If the management system 50 determines that the switch is not operated in step S39 or that the switch is still pressed in step S40, then the management system 50 proceeds to step S42. In step S42, the management system 50 displays a Problem Diagnosis screen (electrical component problem screen) like that shown in FIG. 19 indicating that the switch has failed. The electrical component problem screen displays a message, e.g., "Diagnosis of switch Y is finished. A problem was found," expressing that the Problem Diagnosis has ended and a problem does exist.

Figure 18:
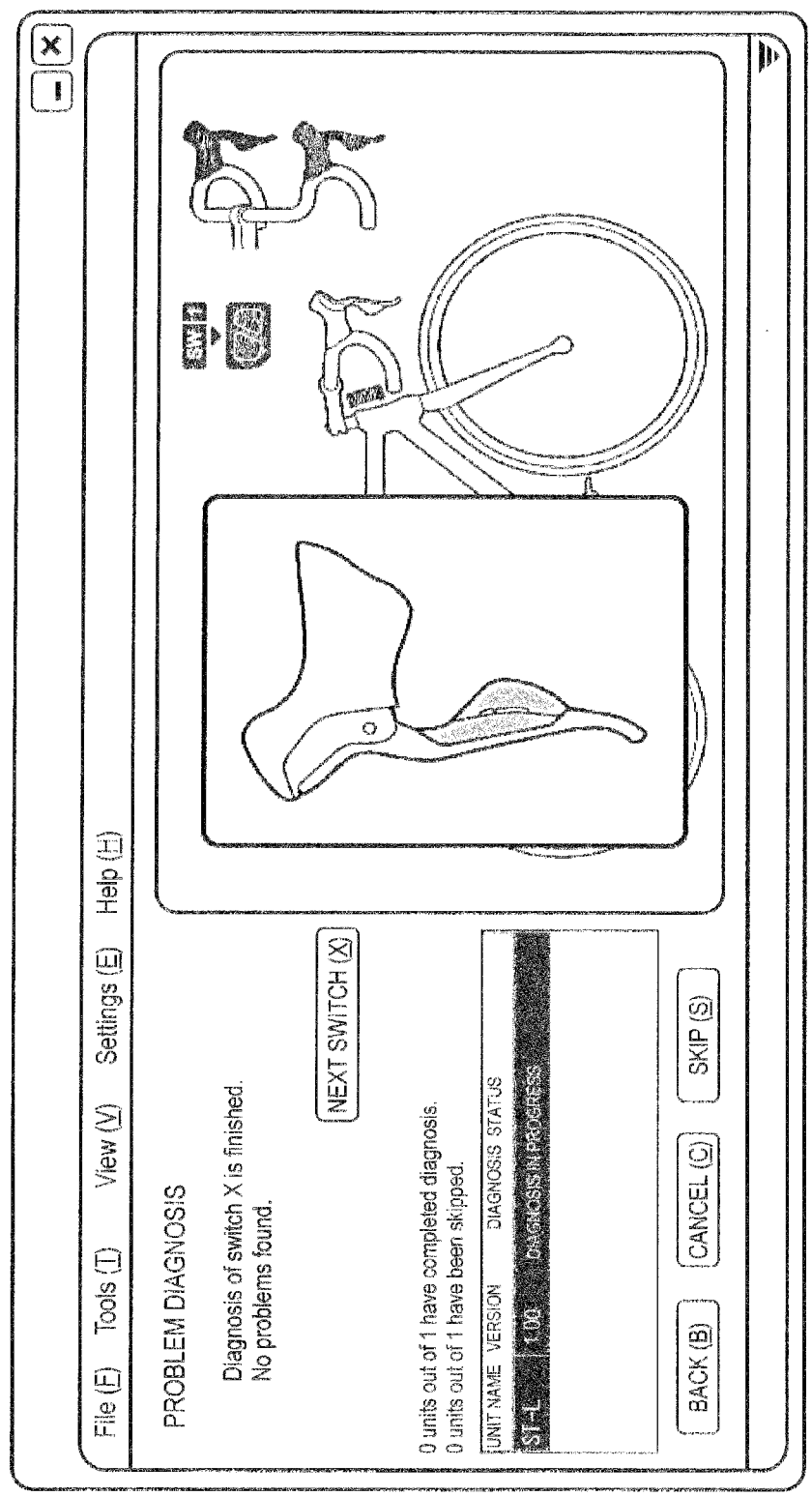
FIG. 18 shows an example of a Problem Diagnosis screen (electrical component normal screen) displayed during a system diagnostic process or an individual diagnostic process.
Figure 19:
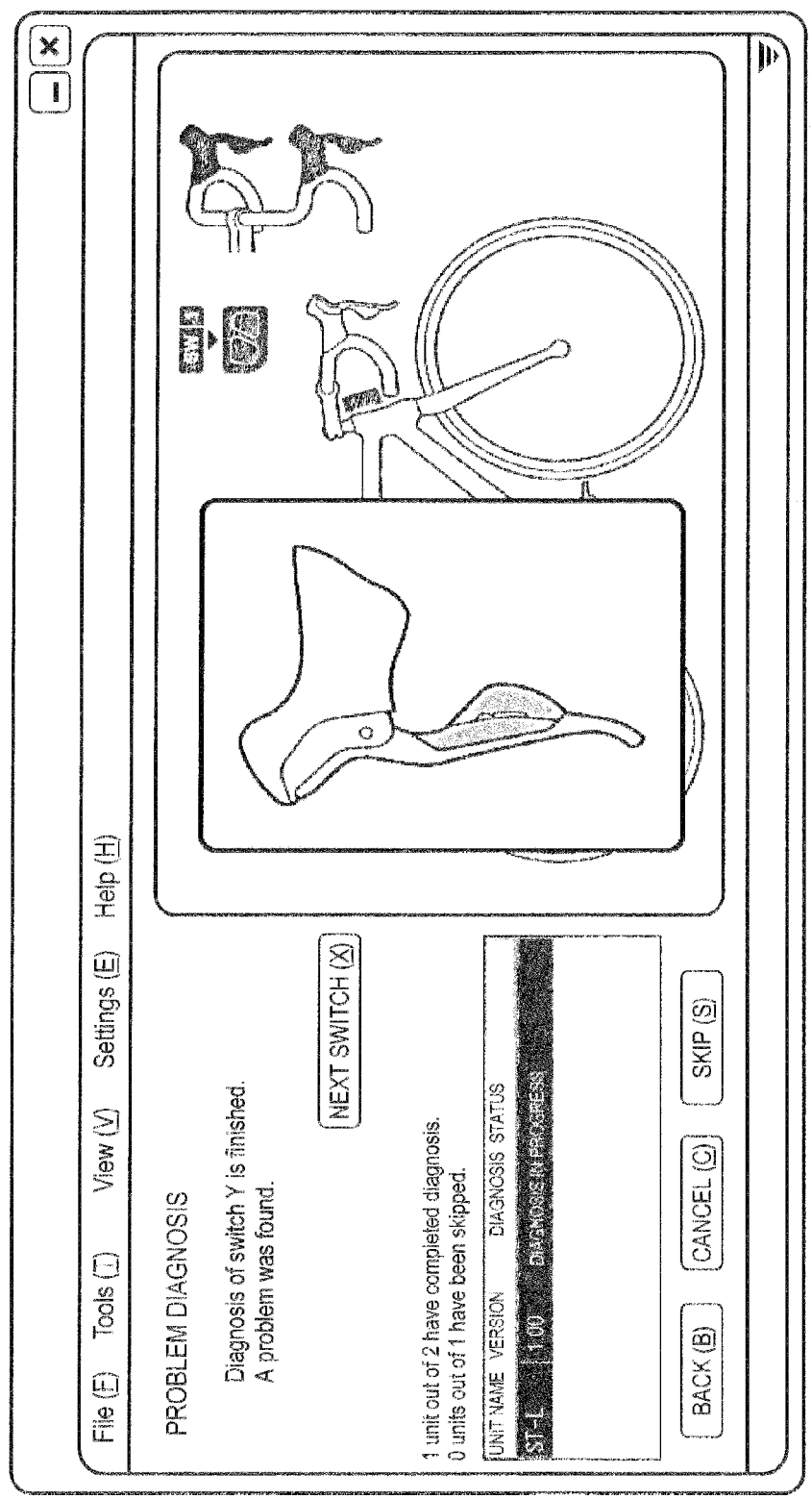
FIG. 19 shows an example of a Problem Diagnosis screen (electrical component problem screen) displayed during a system diagnostic process or an individual diagnostic process.
Figure 20:
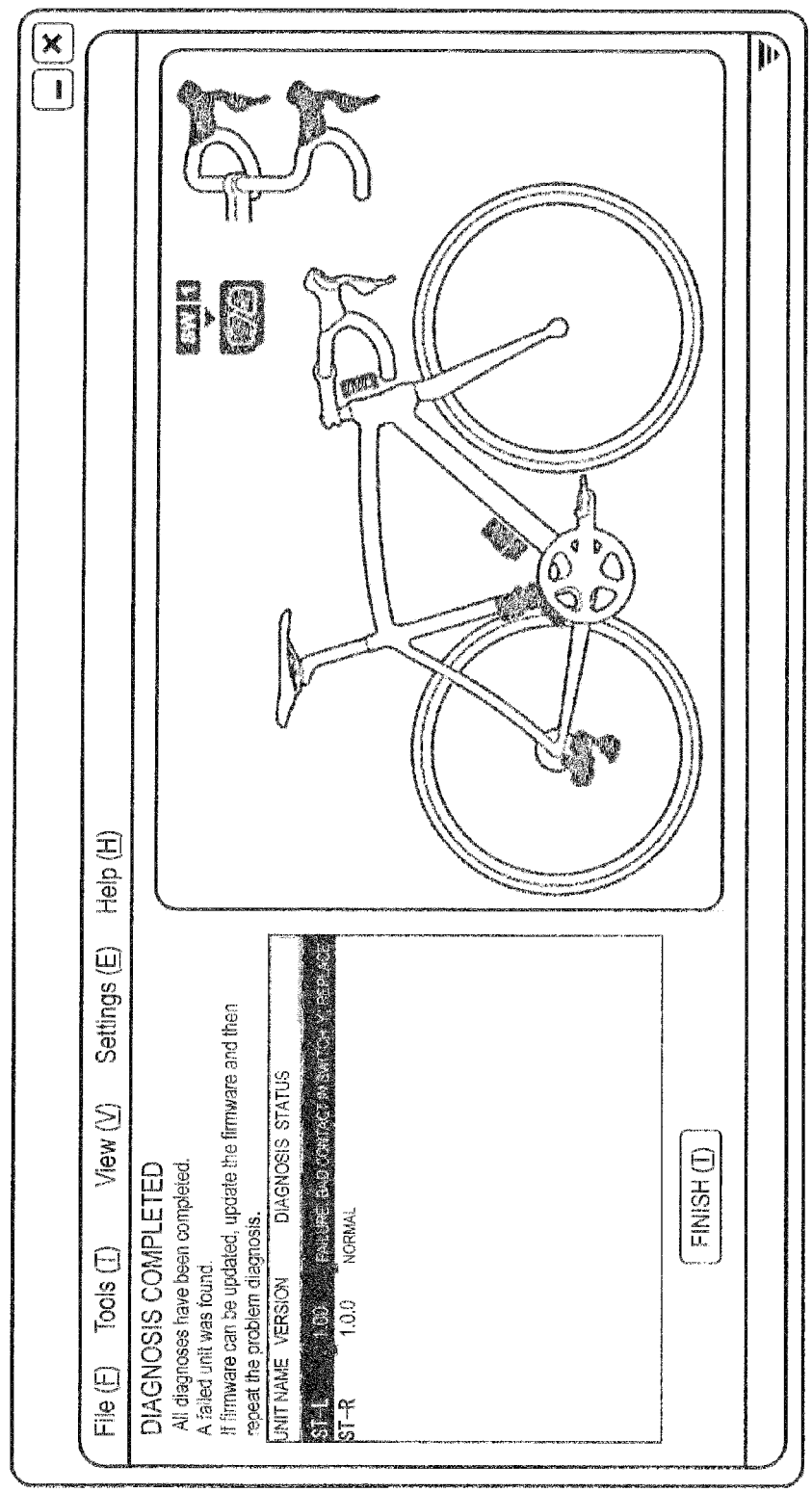
FIG. 20 shows an example of a Problem Diagnosis screen (unit diagnose completed screen) displayed during a problem diagnostic process.

If an operator selects "Next Switch" on the Problem Diagnosis screen shown in FIG. 18 or FIG. 19 using the input device, then the result of step S44 will be "Yes" and the management system 50 will return to step S37. Meanwhile, if when diagnosing of all of the recognized units is finished, the management system 50 moves from step S44 to step S48. In step S48, the management system 50 displays a Problem Diagnosis screen (unit diagnose completed screen) like that shown in FIG. 20 showing diagnose results for all electric devices and returns to the processing shown in FIG. 5. The unit diagnose completed screen indicates that diagnosing has been completed, indicates whether any of the electric devices has failed, presents information regarding the unit if any electric devices have failed, indicates whether any electronic components have failed, presents information regarding electrical components that have failed, presents causes of problem, and presents repair methods or techniques. The unit diagnosing completed screen shown in FIG. 20 displays a message like "All diagnoses have been completed. A failed unit was found. If firmware can be updated, update the firmware and then repeat the problem diagnosis." The unit diagnosing competed screen also displays a list of diagnose results. The diagnose results include such expressions as "Bad contact" as a cause of problem and "Replace" as a repair method.

If it determines in step S37 that the unit to be diagnosed is an electrical component other than a switch, then the management system 50 proceeds from step S37 to step S45. In step S45, an operation appropriate for that electrical component is executed. For example, if the unit is the rear derailleur 10r, then the management system 50 outputs a command to operate the rear derailleur 10r by only a prescribed number of gear positions, thereby operating the rear shifting motor 20r. In step S46, the management system 50 determines if the rear derailleur 10r moved the prescribed number of gear positions and if the movement occurred within a prescribed amount of time based on a signal from a position sensor. If the rear derailleur 10r moved the prescribed number of gear positions and the movement occurred within the prescribed amount of time, then the management system 50 proceeds to step S43 and displays an electrical component normal screen similar to that shown in FIG. 18 expressing that the rear derailleur 10r has not failed. If the rear derailleur 10r did not move the prescribed number of gear positions or the movement did not occur within the prescribed amount of time, then the management system 50 determines that the rear derailleur 10r is malfunctioning and proceeds to step S47. In step S47, the management system 50 displays an electrical component problem screen similar to that shown in FIG. 19 expressing that the rear derailleur 10f has failed. After it finishes these steps, the management system 50 proceeds to step S44. A diagnostic of the front derailleur 10f is conducted in a similar manner to the diagnostic of the rear derailleur 10r.

Figure 5:
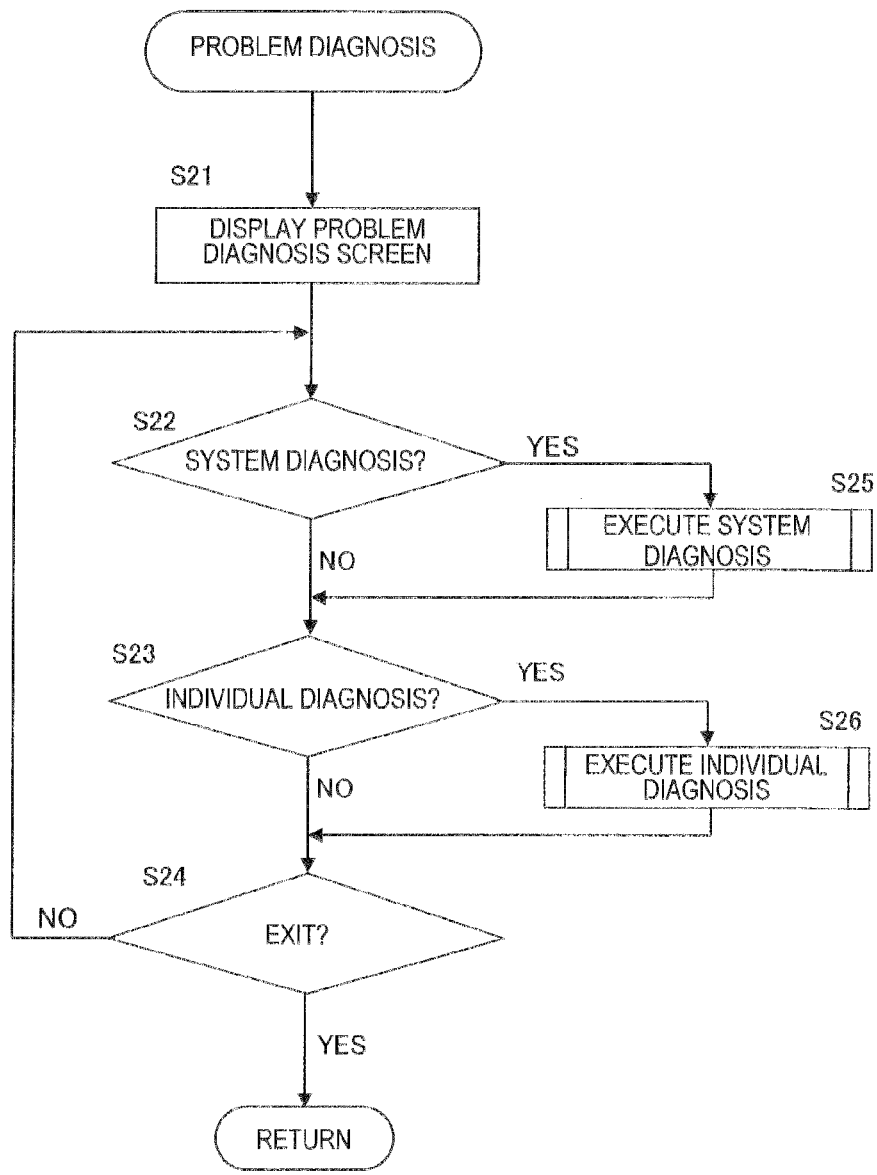
FIG. 5 is a flowchart of a problem diagnostic process.
Figure 7:
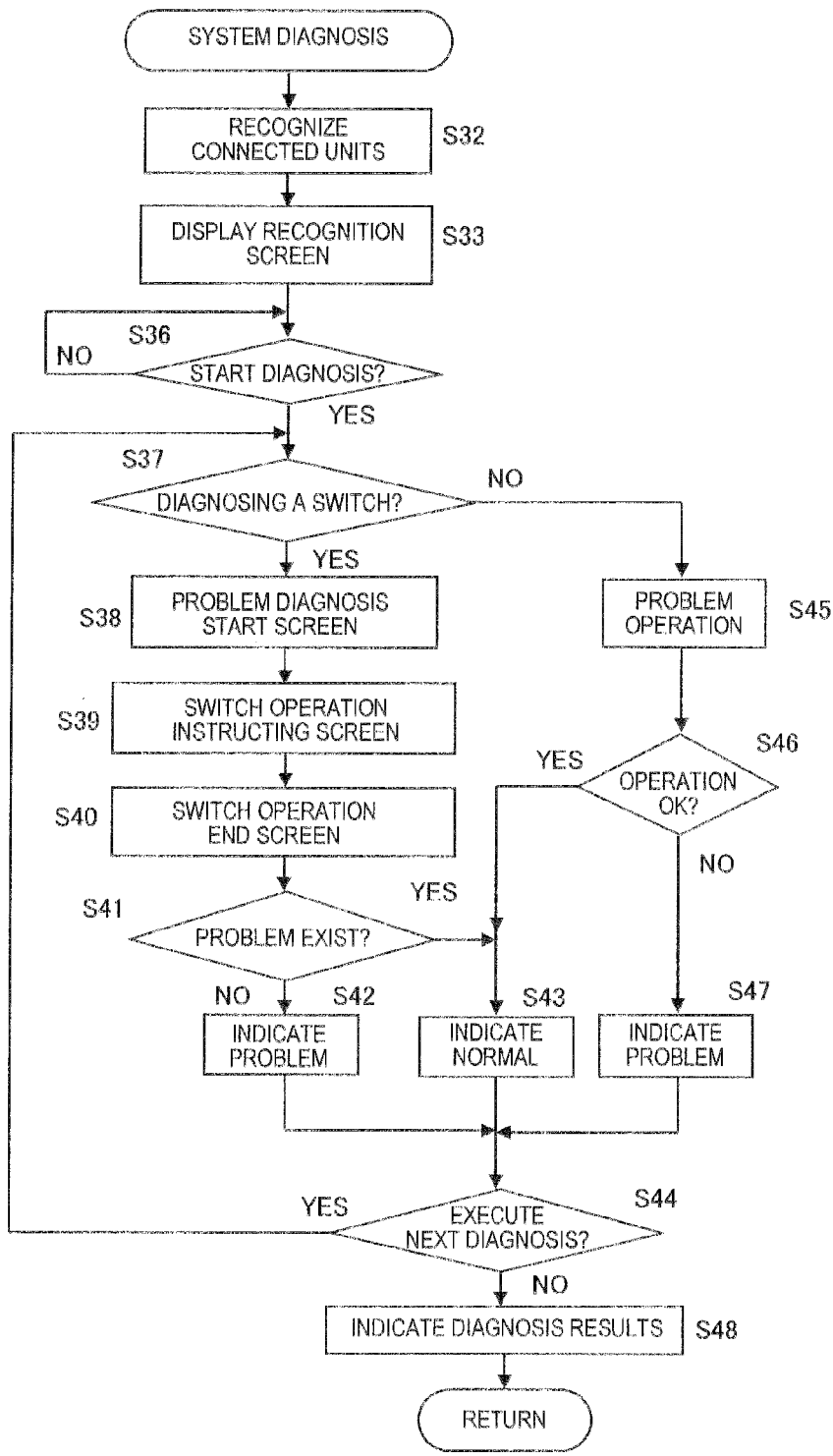
FIG. 7 is a flowchart of an individual diagnosis process.

If it determines in step S23 of FIG. 5 that individual diagnosis has been selected, then the management system 50 proceeds to step S26 and executes the individual diagnostic process shown in FIG. 7. The individual diagnostic process shown in FIG. 7 is the same as the system diagnostic process, except that step S31, step S34 and step S35 are different. Thus, an explanation of the individual diagnostic process is omitted.

Figure 21:
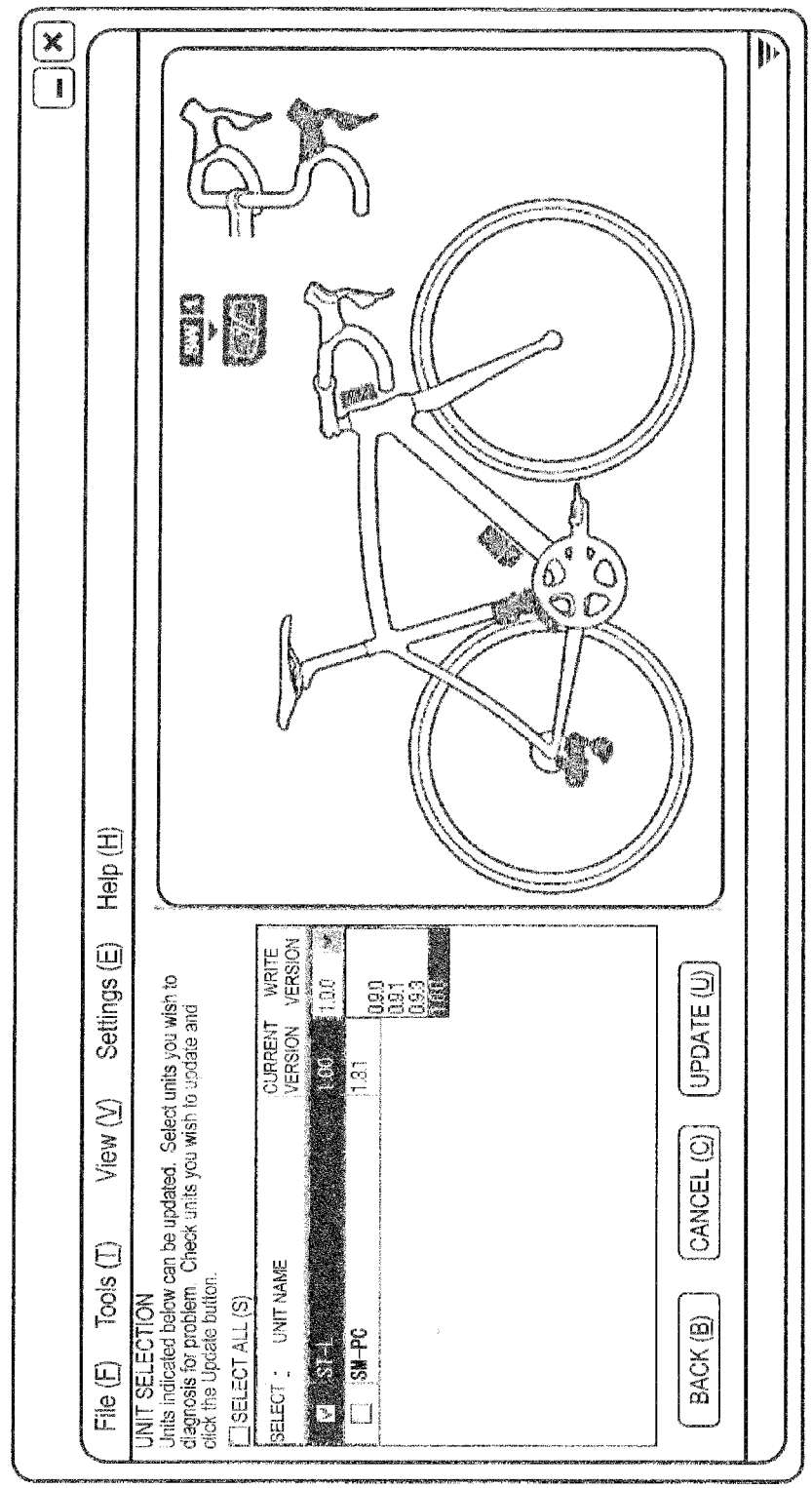
FIG. 21 shows an example of a Firmware Update screen.

If it determines that Firmware Update has been selected in step S3 of FIG. 4, then the management system 50 proceeds to step S9. In step S9, the management system 50 displays a firmware updating screen like that shown in FIG. 21. From the firmware updating screen, an operator can select units that can be updated. The management system 50 reads version information of the firmware from the recognized units, displays the version information, and displays a version of the firmware that can be installed over the current version in a selectable manner. The management system 50 reads the version of firmware from the recognized units. An operator uses the input device to select a unit and corresponding firmware version to be subjected to a firmware update and selects the button "Update" displayed on the screen. In this way, the operator can easily update the firmware to a later version or an earlier version.

Figure 22:
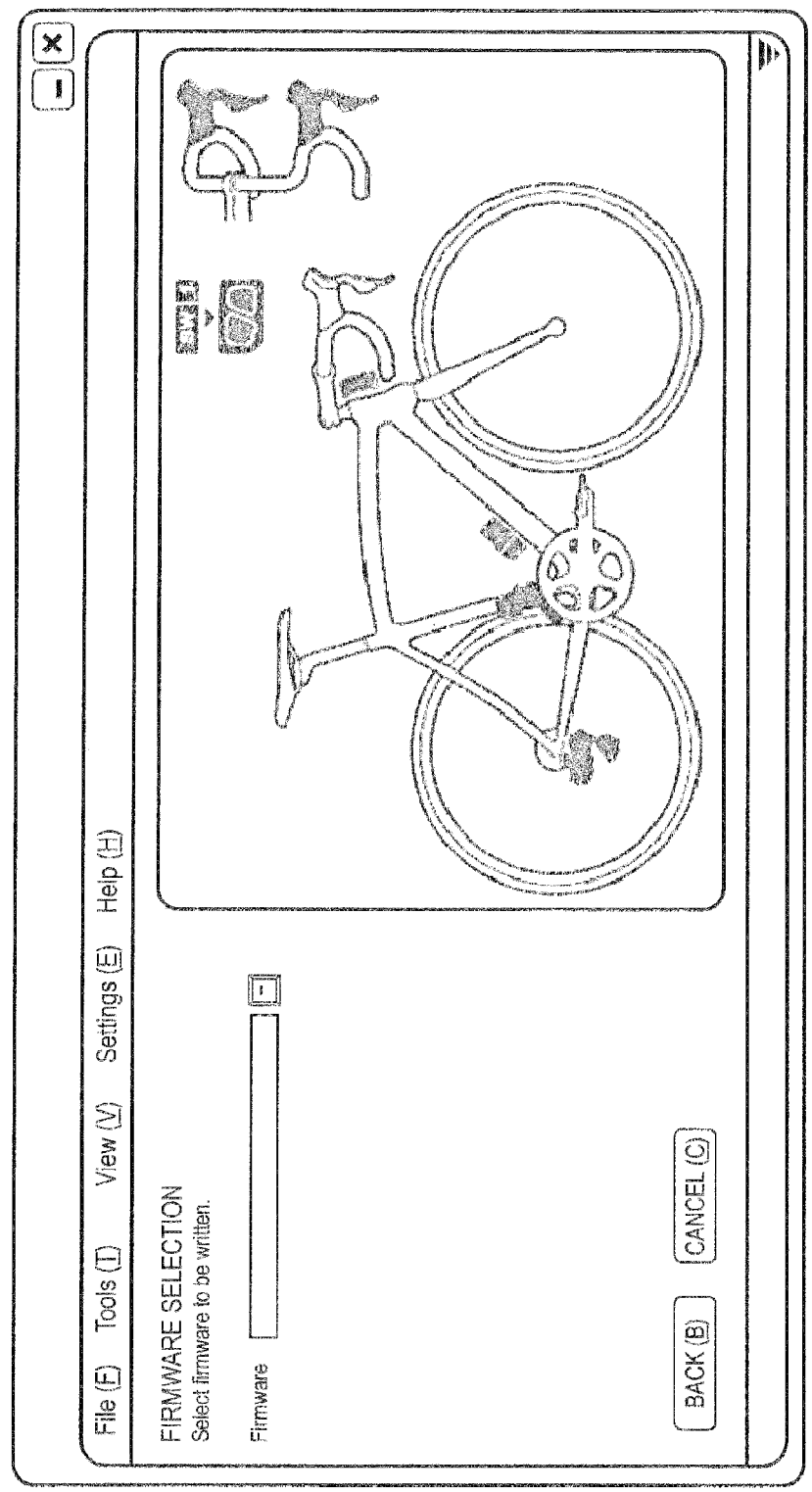
FIG. 22 shows an example of a Firmware Write screen.

If it determines that Firmware Write has been selected in step S4 of FIG. 4, then the management system 50 proceeds to step S10. Initial Firmware Write is a process in which the management system 50 forcefully writes firmware to a unit. Consequently, the initial firmware write processing is executed with the management system 50 connected only to the one unit to which the firmware is to be written. In step S10, the management system 50 displays a firmware writing screen like that shown in FIG. 22. Firmware corresponding to the unit to which firmware is to be written is stored in a plurality of files in the management system. From the firmware writing screen, the firmware can be selected from, for example, a pull down menu.

If an item other than "Exit" (e.g., "Help", "Tools") is selected from the menu bar in step S5, then the management system 50 proceeds to step S11 and the selected item is executed.

When this bicycle electrical system diagnostic device 30 is connected to any unit of a bicycle electrical system 7 through the communication adapter 40, the management system 50 can recognize a plurality of units connected to the bicycle electrical system 7. Consequently, regardless of which unit of the bicycle electrical system 7 the diagnostic device 30 is connected to, all of the units can be diagnosed and the time required for diagnosing can be reduced.

Other Embodiments

While only selected embodiments have been chosen to illustrate the present invention, it will be apparent to those skilled in the art from this disclosure that various changes and modifications can be made herein without departing from the scope of the invention as defined in the appended claims. Although in the previously explained embodiment, the communication adapter 40 and the management system 50 are provided as separate entities, it is acceptable for them to be provided as a single unit. Also, although a general purpose PC is used as the management system 50 in the embodiment, it is acceptable to use a dedicated computer.

Although the diagnostic completed screen displays causes of problems and repair techniques in the previously explained embodiment, it is acceptable if such information is not displayed. Displaying causes of problem and repair techniques makes it easier for an operator to perform repairs, and not displaying causes of problem and repair techniques reduces the processing load of the management system 50.

Figure 23:
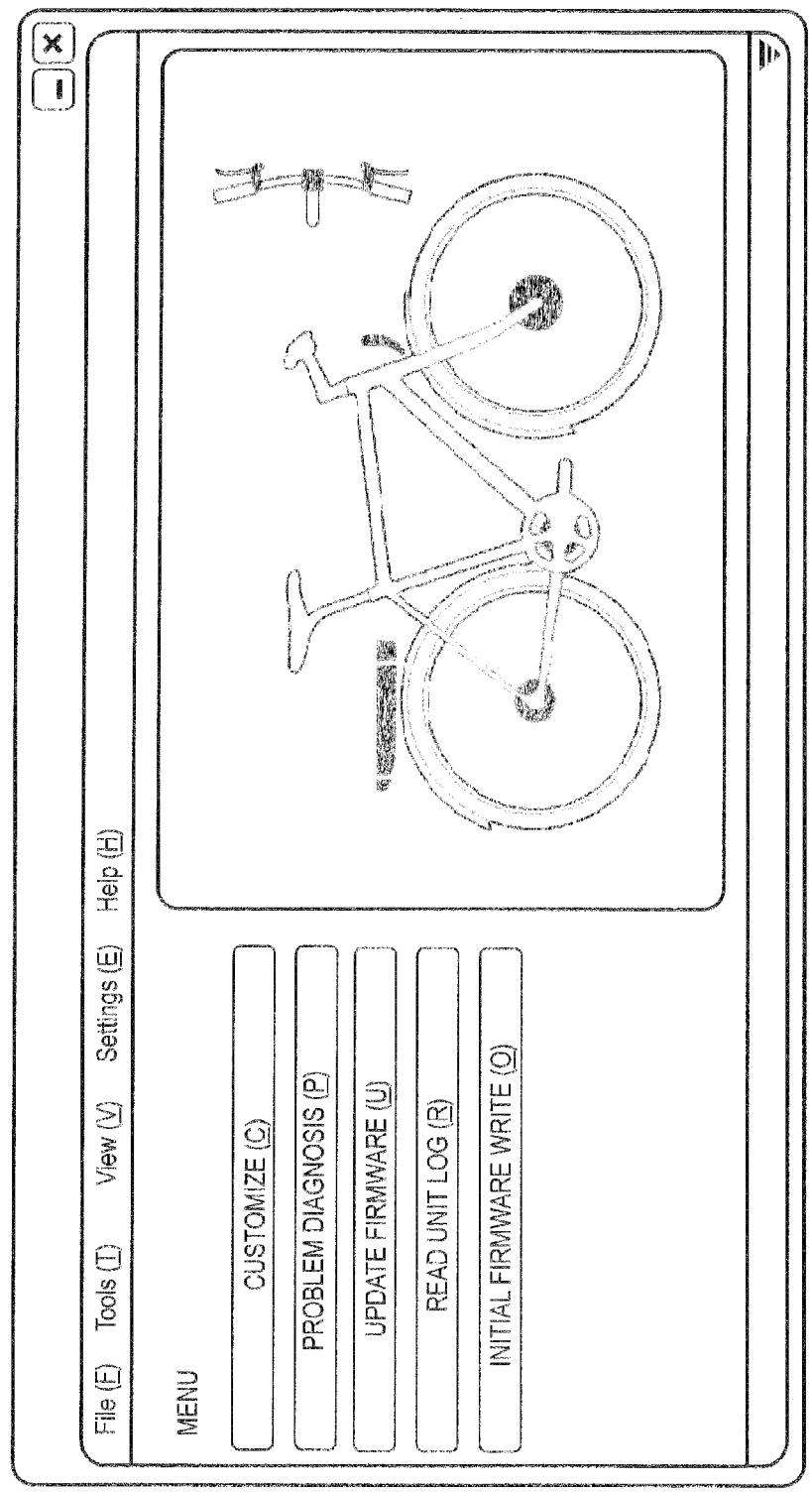
FIG. 23 shows an example of a Diagnosis process menu screen in accordance with another embodiment.

Although the previously explained embodiment exemplifies a diagnostic device for an electrical system installed on a road bike, the invention is not limited to such a bicycle. For example, the invention can be applied to a diagnostic device for an electrical system of an assisted bicycle configured to employ a motor to supplement a drive force produced by a person. FIG. 23 shows an example of a menu screen of an electrical system diagnostic device for an assisted bicycle configured to employ a motor to supplement a drive force produced by a person. Basically the only differences with respect to the previously explained embodiment are that the electric devices installed on the bicycle are different and that a unit log read operation can be executed. The unit log includes such information as a temperature of a motor, a temperature of a circuit board operating the motor, a current of the motor, a communication error with respect to the battery unit, a number of starts, a number of times a switch has been operated, and an amount of time a lamp has been illuminated.

Also components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A bicycle electrical system diagnostic device for a bicycle electrical system in which a plurality of electric devices are connected, the bicycle electrical system diagnostic device comprising:
   a connecting section configured to be connected to and disconnected from the electrical system;
   a user input device configured to receive user inputs; and
   a computer including
      a recognizing section programmed to communicate with the electrical system by the connecting section and recognize any of the plurality of electric devices connected to the electrical system diagnostic device by receiving identification information from any of the plurality of electric devices,
      a problem diagnosing section programmed to determine if any of the plurality of electric devices connected to the connecting section has failed, and
      an indicating section programmed to display any of the plurality of electric devices in a visual depiction of a bicycle on a screen with any of the plurality of electric devices that are recognized by the recognizing section displayed in a different format than any of the plurality of electric devices that are not recognized by the electric device recognizing section.

2. The bicycle electrical system diagnostic device as recited in claim 1 wherein
   the indicating section is further programmed to present any of the plurality of electric devices that may be connected to the electrical system diagnostic device to be selected by a user using the user input device, and
   the problem diagnosing section is further programmed to target for diagnosing and to diagnose any of the plurality of electric devices connected to the connecting section, the indicating section displaying in the visual depiction of a bicycle an of the plurality of electric devices targeted for diagnosing in a different format than any of the plurality of electric devices that are not targeted for diagnosing,
   the computer being further programmed to indicate on the visual depiction of the bicycle to the user any of the plurality of electric devices that were not recognized based on matching any of the plurality of electric devices selected by the user using the input device with any of the plurality of electric devices recognized by the recognizing section.

3. The bicycle electrical system diagnostic device as recited in claim 2, wherein the connecting section is configured to be connected directly to any of the plurality of electric devices or to be connected in between any of the plurality of electric devices.

4. The bicycle electrical system diagnostic device as recited in claim 2, wherein
the indicating section indicates a failed electric device upon the problem diagnosing section determining that a problem exists in any of the plurality of electric devices.

5. The bicycle electrical system diagnostic device as recited in claim 2, wherein
the problem diagnosing section determines if an electrical component contained in any of the plurality of electric devices has failed.

6. The bicycle electrical system diagnostic device as recited in claim 5, wherein
the indicating section indicates an electrical component that the problem diagnosing section has determined to have failed upon the problem diagnosing section determining that a problem exists in any of the plurality of electric devices.

7. The bicycle electrical system diagnostic device as recited in claim 2, wherein
the indicating section indicates a cause of problem upon the problem diagnosing section determining that a problem exists in any of the plurality of electric devices.

8. The bicycle electrical system diagnostic device as recited in claim 2, wherein
the indicating section indicates a repair technique corresponding to the problem upon the problem diagnosing section determining that a problem exists in any of the plurality of electric devices.

9. The bicycle electrical system diagnostic device as recited in claim 2, wherein
the connecting section is connected to the electrical system using a power line communication line of any of the plurality of electric devices of the bicycle electrical system.

10. The bicycle electrical system diagnostic device as recited in claim 9, wherein
the connecting section is configured to be connected to a power line communication terminal of any of the plurality of electric devices of the bicycle electrical system.

11. The bicycle electrical system diagnostic device as recited in claim 2, further comprising
a communication cable coupled to the connecting section.

12. The bicycle electrical system diagnostic device as recited in claim 2, further comprising
a customizing section programmed to allow the user to change any of the plurality of electric devices targeted by the problem diagnosis section for diagnosing.

13. The bicycle electrical system diagnostic device as recited in claim 12, wherein
the customizing section is programmed to allow the user to change a function setting of any of the plurality of electric devices targeted by the problem diagnosis section for diagnosing.

14. The bicycle electrical system diagnostic device as recited in claim 1, wherein the problem diagnosing section is further programmed to allow the user to select between a system diagnosis selection, and an individual diagnosis section.

15. The bicycle electrical system diagnostic device as recited in claim 14, wherein
after selection of system diagnosis, the computer is programmed to allow the user to select any of the plurality of electric devices to be targeted by the problem diagnosing section.

16. The bicycle electrical system diagnostic device as recited in claim 14, wherein
after selection of individual diagnosis, the problem diagnosing section is programmed to automatically diagnose any of the plurality of electric devices connected to the connecting section.

17. The bicycle electrical system diagnostic device as recited in claim 1, wherein
the problem diagnosing section determines if an electrical component contained in any of the plurality of electric devices has failed.

18. The bicycle electrical system diagnostic device as recited in claim 1, wherein
the indicating section is programmed to allow a user to select any of the plurality of electric devices connected to the connecting section as not recognized by the recognizing section.

* * * * *